US006231744B1

(12) United States Patent
Ying et al.

(10) Patent No.: US 6,231,744 B1
(45) Date of Patent: May 15, 2001

(54) PROCESS FOR FABRICATING AN ARRAY OF NANOWIRES

(75) Inventors: Jackie Y. Ying, Winchester; Zhibo Zhang, Cambridge, both of MA (US); Lei Zhang, New Castle, DE (US); Mildred S. Dresselhaus, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/064,439

(22) Filed: Apr. 22, 1998

Related U.S. Application Data
(60) Provisional application No. 60/044,008, filed on Apr. 24, 1997.

(51) Int. Cl.[7] .......................... C25D 11/04; C25D 11/08; C25D 5/34; C25D 5/44; C25D 5/48

(52) U.S. Cl. ..................... 205/324; 205/206; 205/213; 205/221; 205/223; 205/328; 427/294

(58) Field of Search .................................... 205/213, 221, 205/223, 131, 324, 328, 206; 427/294

(56) References Cited

U.S. PATENT DOCUMENTS

| | | | |
|---|---|---|---|
| 3,945,893 | * 3/1976 | Ishimori et al. | 204/16 |
| 5,114,877 | 5/1992 | Paoli et al. | 437/129 |
| 5,202,290 | 4/1993 | Moskovits | 437/233 |
| 5,330,612 | 7/1994 | Watanabe | 117/86 |
| 5,581,091 | 12/1996 | Moskovits et al. | 257/9 |
| 5,747,180 | * 5/1998 | Miller et al. | 428/601 |

FOREIGN PATENT DOCUMENTS 0283311  9/1988  (EP) .

OTHER PUBLICATIONS

"A New Family of Mesoporous Molecular Sieves Prepared with Liquid Crystal Templates", Beck et al., J. Am. Chem. Soc. 1992, 114, 10834–10843.

"Fabrication of quantum wire structures by in–situ gas etching and selective–area metalorganic vapor phase epitaxy regrowth", Shimoyama et al., Journal of Crystal Growth 145 (1994) 734–739.

"Fabrication of Quantum Wire and Minute Buried Heterostructure by In Situ Etching and Selective MOCVD Growth", Ogura, et al., Part I, No. 2B, Feb. 1990, pp. 1353–1356 and last page unnumbered.

"Structural Features of Oxide Coatings on Aluminum", Keller, et al., Journal of the Electrochemical Society, vol. 100, No. 9, Sep. 1953, pp. 411–419.

"Properties of Porous Anodic Aluminum Oxide Films as Membranes", Itaya, et al., Journal of Chemical Engineering of Japan, vol. 17, No. 5 1984, pp. 514–520.

(List continued on next page.)

*Primary Examiner*—Edna Wong
(74) *Attorney, Agent, or Firm*—Daly, Crowley & Mofford, LLP

(57) ABSTRACT

An array of nanowires having a relativley constant diameter and techniques and apparatus for fabrication thereof are described. In one embodiment, a technique for melting a material under vacuum and followed by pressure injection of the molten material into the pores of a porous substrate produces continuous nanowires. In another embodiment, a technique to systematically change the channel diameter and channel packing density of an anodic alumina substrate includes the steps of anodizing an aluminum substrate with an electrolyte to provide an anodic aluminum oxide film having a pore with a wall surface composition which is different than aluminum oxide and etching the pore wall surface with an acid to affect at least one of the surface properties of the pore wall and the pore wall composition.

36 Claims, 16 Drawing Sheets

OTHER PUBLICATIONS

"The formation of controlled–porosity membranes from anodically oxidized aluminum", Furneaux, et al., Nature vol 337, Jan. 12, 1989.

"Micropolarizer made of the anodized alumina film", Saito, et al., Appl. Phys. Lett. 55 (7), Aug. 14, 1989.

"A Composite Palladium and Porous Aluminum Oxide Membrane for Hydrogen Gas Separation", Konno, et al., Journal of Membrane Science, 37, (1988) 193–197.

"Electrochemical Fabrication of CdS Nanowire Arrays in Porous Anodic Aluminum Oxide Templates", Routkevitch, et al., J. Phys. Chem. 1996, 100, 14037–14047.

"Ordered Metal Nanohole Arrays Made by a Two–Step Replication of Honeycomb Structures of Anodic Alumina", Masuda, et al., Science, vol. 268, Jun. 9, 1995.

"Preparation of Ultrafine Carbon Tubes in Nanochannels of an Anodic Aluminum Oxide Film", Kyotani, et al., 1996, American Chemical Society, Chem. Mater., vol. 8, No. 8.

"Injection Under High Pressure of Molten Metals into Crystalline Materials Containing Regular Cavities", Bogomolov, Soviet Physics—Solid State, vol. 13, No. 3, Sep., 1971.

"Resistivity Anomaly in Thin Bi Wires: Possibility of a One–Dimensional Quantum Size Effect", Gurvitch, Journal of Law Temperature Physics, vol. 38, Nos. 5/6, 1980.

"Nanowire Array Composites", Huber, et al., Science, vol. 263, Feb. 11, 1994.

"The Physical Review, The Dynamics of Capillary Flow", Washburn, Second Series, Mar., 1921, vol. XVII, No. 3.

"Wetting: statics and dynamics", P.G. de Gennes, Reviews of Modern Physics, vol. 57, No. 3, Part I, Jul. 1985.

"Capillarity–induced filling of carbon nanotubes", Ajayan, et al. Nature, vol. 361, Jan. 28, 1993.

"Nucleation and growth of porous anodic films on aluminum", Lanzerotti, et al., Nature vol. 272, Mar. 30, 1978.

"Computer Simulation of Inorganic Membrane Morphology Part 3. Anodic Alumina Films and Membranes", Randon, et al., Journal of Colloid and Interface Science 169, 335–341 (1995).

"The morphology and mechanism of formation of porous anodic films on aluminum", O'Sullivan et al., Proc. Roy. Soc. Lond. A. 317, 511–543 (1970).

"Variation of the connectivity of the electron constant–energy surface in Bi under pressure", Brandt, et al., Sov. Phys. JETP 47(5), May 1978.

"Nanocapillarity and Chemistry in Carbon Nanotubes", Ugarte, et al., Science, vol. 274, Dec. 13, 1996.

C.A. Huber, et al. "Nanowire Array Composites," Science vol. 263, pp. 800–802, Feb. 11, 1994.

Dmitri Routkevitch, et al. "Nonlithographic Nano–Wire Arrays: Fabrication, Physics, and Device Application," IEEE Transactions on Electron Devices, vol. 43, No. 10, pp. 1646–1658, Oct., 1996.

Dmitri Routkevitch, et al. "Porous Anodic Alumina Templates for Advanced Nanofabrication," Elecrochemical Society Proceedings, vol. 97–7, pp. 350357 *No Date Available.

H. M. Cheng, *F. Li, and G. Su—Institute of Metal Research, Academia Sinica, 72 Wenhua Rd., Shenyang, 110015 China.

H.Y. Pan and L. L. He—Lab for Atomic Imaging of Solids, Institute of Metal Research, Academia Sinica, 72 Wenhua Rd., Shenyang, 110015 China.

X. Sun—Department of Physics, Massachusetts Institute of Technology, Cambridge Massachusetts 02139.

M.S. Dresselhaus—Department of Electrical Engineering and Computer Scients and Department of Physics, Massachusetts Institute of Technology, Cambridge, MA 02139— "Large–Scale and Low–Cost Synthesis of Single–Walled Carbon Nanotubes by Catalytic Pyrolysis of Hydrocarbons"—Pp. 1–3, (Jan. 13, 1998).

*Also at Department of Physics, Massachusetts Institute of Technology, Cambridge, MA 02139.

Huber et al., "Nanowire Array Composite", Science, vol. 263, pp. 79–81, Feb. 1994.*

Keller et al., "Structural Features of Oxide Coatings on Aluminum", J. of the Electrochem. Soc., vol. 100, No. 9, pp. 411–419, Sep. 1953.*

O'Sullivan et al., "The Morphology and Mechanism of Formation of Porous Anodic Films on Aluminum", Proc. Roy. Soc. Lond. A. 317, pp. 511–543, 1970*.*

* cited by examiner

PROCESS FOR FABRICATING AN ARRAY OF NANOWIRES

RELATED APPLICATIONS

This application claims priority under 35 U.S.C. §119(e) from Provisional Application No. 60/044,008, filed Apr. 24, 1997.

GOVERNMENT RIGHTS

This invention was made with Government support under Contract No. CTS-9257223, awarded by the National Science Foundation and Contract No. N00167-92-K-0052 awarded by the Department of the Navy. The Government has certain rights in this invention.

FIELD OF THE INVENTION

This invention relates generally to nanowires and more particularly to nanowires having a diameter which is relatively small and uniform and techniques for fabrication thereof.

BACKGROUND OF THE INVENTION

As is known in the art, a nanowire refers to a wire having a diameter typically in the range of about one nanometer (nm) to about 500 nm. Nanowires are typically fabricated from a metal or a semiconductor material. When wires fabricated from metal or semiconductor materials are provided in the nanometer size range, some of the electronic and optical properties of the metal or semiconductor materials are different than the same properties of the same materials in larger sizes. Thus, in the nanometer-size range of dimensions, the physical dimensions of the materials may have a critical effect on the electronic and optical properties of the material.

Quantum confinement refers to the restriction of the electronic wave function to smaller and smaller regions of space within a particle of material referred to as the resonance cavity. Semiconductor structures in the nanometer size range exhibiting the characteristics of quantum confinement are typically referred to as zero-dimension (OD) quantum dots or more simply quantum dots when the confinement is in three dimensions. Quantum dots are provided from crystalline particles having a diameter less than about ten nanometers which are embedded within or on the surface of an organic or inorganic matrix and which exhibit quantum confinement in three directions.

Similarly, when the confinement is in one dimension, the structures are referred to as 2D quantum well superlattices or more simply "quantum wells," Such superlattices are typically generated by the epitaxial growth of multi-layer active crystals separated by barrier layers. The 2D quantum wells have typically enhanced carrier mobility and also have characteristics such as the quantum Hall effect and quantum confined Stark effect. 2D quantum well superlattice structures also typically have magnetoresistance and thermoelectric characteristics which are enhanced relative to 3D materials. One problem with quantum well superlattices, however is that they are relatively expensive and difficult to produce and fabrication of quantum well superlattices are limited to several material systems including group IV semiconductors (such as SiGe), group III-V compounds (such as GaAs), group II-VI compounds (such as CdTe) and group IV-VI compounds (such as PbTe).

When the quantum confinement is in two dimensions, the structures are typically referred to as a one-dimensional quantum wires or more simply as quantum wires. A quantum wire thus refers to a wire having a diameter sufficiently small to cause confinement of electron gas to directions normal to the wire. Such two-dimensional (2D) quantum confinement changes the wire's electronic energy state. Thus, quantum wires have properties which are different from their three-dimensional (3D) bulk counterparts.

For example, metallic wires having a diameter of 100 nm or less have specific properties typically referred to is quantum conduction phenomena. Quantum conduction phenomena include but are not limited to: (a) survival of phase information of conduction electrons and the obviousness of the electron wave interference effect; (b) breaking of Ohm's Law and the dependence of the electrical conductivity and thermal conductivity characteristics of the wire on the configuration, diameter and length of the metal; (c) greater fluctuation of wire conductivity; (d) noises observed within the material depend upon the configuration of the sample and the positions of impurity atoms; (e) a mark surface effect is produced; and (f) visible light enters throughout the thin wire causing a decrease in conductivity.

In transport-related applications, quantum wire systems exhibit a quantum confinement characteristic which are enhanced relative to quantum well systems. It is thus desirable to fabricate quantum wire systems or more generally nanowire systems for use in transport-related applications. One problem with nanowire systems, however, is that it is relatively difficult to fabricate nanowires having a relatively small, uniform diameter and a relatively long length.

One technique for fabricating quantum wires utilizes a micro lithographic process followed by metalorganic chemical vapor deposition (MOCVD). This technique may be used to generate a single quantum wire or a row of gallium arsenide (GaAs) quantum wires embedded within a bulk aluminum arsenide (AlAs) substrate. One problem with this technique, however, is that microlithographic processes and MOCVD have been limited to GaAs and related materials. It is relatively difficult to generate an array of relatively closely spaced nanowires using conventional microlithographic techniques due to limitations in the tolerances and sizes of patterns which can be formed on masks and the MOCVD processing required to deposit the material which forms the wire. Moreover, it is desirable in some applications, to fabricate two and three dimensional arrays of nanowires in which the spacing between nanowires is relatively small.

Another problem with the lithographic-MOCVD technique is that this technique does not allow the fabrication of quantum dots or quantum wires having diameters in the 1–100 nanometer range. Moreover, this technique does not result in a degree of size uniformity of the wires suitable for practical applications.

Another approach to fabricate nanowire systems which overcomes some of the problems of the lithographic technique, involves filling naturally occurring arrays of nanochannels or pores in a substrate with a material of interest. In this approach, the substrate is used as a template. One problem with the porous substrate approach is that it is relatively difficult to generate relatively long continuous wires having relatively small diameters. This is partly because as the pore diameters become small, the pores tend to branch and merge partly because of problems associated with filling relatively long pores having relatively small diameters with a desired material.

Anodic alumina and mesoporous materials, for example, each are provided having arrays of pores. The pores can be filled with an appropriate metal in a liquid state. The metal solidifies resulting in metal rods filling the pores of the substrate. Surface layers of the substrate surrounding the rods are then removed, by etching for example, to expose the ends of the metal rods. In some applications the rods can be chemically reacted to form semiconductor materials. Some substrate materials, however, such as anodic alumina are not suitable host templates for nanowires due to the lack of a systematic technique to control pore packing density, pore diameter and pore length in the anodic alumina.

Nevertheless, porous materials such as anodic alumina have been used to synthesize a variety of metal and semiconductor nanoparticles and nanowires by utilizing chemical or electrochemical processes to fill pores in the anodic alumina. Such liquid phase approaches, however, have been limited to Nickel (Ni), Palladium (Pd), Cadmium sulfide (CdS) and possibly Gold (Au) and Platinum (Pt). One problem with chemical or electrochemical processes is that success of the processes depends upon finding appropriate chemical precursors. Another problem with this approach is that it is relatively difficult to continuously fill pores having a relatively small diameter and a relatively long length e.g. a length greater than 2.75 microns.

Still another approach to providing nanowires is to utilize an anodic alumina substrate to prepare carbon nanotubes inside the pores of the anodic alumina by the carbonization of propylene vapor. One problem with such a gas phase reaction approach is that it is relatively difficult to generate dense continuous nanowires.

To overcome the problems of filling pores in a template, high pressure-high temperature material injection techniques have been used. In these techniques, a molten metal is injected into relatively small diameter pores of a template to make nanostructure composites. In one technique, a hydrostatic press provides a relatively high pressure to inject metals such as indium (In), gallium(Ga) or mercury (Hg) into the pores of the substrate. This technique may also be used to fill a single glass nanotube having a diameter of about 100 nm with a molten metal such as bismuth (Bi). The technique may also be used to fill porous anodic alumina with channel diameters larger than 200 nm with various metal melts. One equation which may be used to compute the rate at which a molten metal can be injected into a pore of a template is shown in Equation 1:

$$l(t) = \sqrt{\frac{(P_a + 2\gamma_{lv}\cos\theta/r)(r^2 + 4\varepsilon \cdot r)t}{4\eta}} \quad \text{Equation 1}$$

in which:

$l(t)$ is an injection length at time $t$;

$P_a$ is an external pressure;

$\gamma_{lv}$ is a liquid-vapor surface tension;

$\theta$ is a contact angle between the liquid and a wall of the pore;

$r$ is a pore radius;

$\eta$ is a viscosity of the liquid; and $\varepsilon$ is a coefficient of slip of the liquid.

The contact angle $\theta$ may be computed using Young's equation which may be expressed as:

$$\gamma_{lv} \cos\theta = \gamma_{sv} - \gamma_{sl}$$

in which $\gamma_{sv}$ and $\gamma_{sl}$ are the solid-vapor and solid-liquid surface tensions, respectively. For a ceramic/metal melt system, the difference between the solid-vapor surface tension vy, and the solid-vacuum surface tension $\gamma_{so}$ is negligible. Through simple thermodynamic calculations, the following relation for the contact angle $\theta$ is reached:

$$\cos\theta = (2V_{sl}/V_{ll}) - 1$$

in which $V_{sl}$ and $V_{ll}$ are the solid-liquid and liquid-liquid interaction energies, respectively.

In metallic liquids the liquid-liquid interaction energy $V_{ll}$ is relatively strong. Thus, when injecting metallic liquids in prior art techniques the contact angle $\theta$ was assumed to be close to 180°.

With such an assumption, the external pressure needed to drive the molten metal into a channel with diameter D is $P_a \geq -4 \gamma_{lv}/D$.

As an example, the solid-liquid surface tension $\gamma_{sl}$ of liquid bismuth is about 375 dyn/cm. Assuming the contact angle $\theta$ is 180°, a pressure of 1,150 bar is needed to fill a pore having a diameter of about 13 nm. Such a high pressure can be achieved by a hydrostatic press. The melting temperature of bismuth, however, is 271.5° C. Thus, to fill a pore having a diameter of about 13 nm, a hydrostatic press must provide a pressure of 1,150 bar at a temperature of at least 271.5° C. Due to the combination of high pressure and high temperature, and the corresponding problems associated with operating hydrostatic equipment at such high temperatures and pressures, it was heretofore not practically possible to inject liquids and, in particular, liquid metals into pores having relatively small diameters.

Moreover, even if relatively small diameter pores in anodic alumina could be filled, as explained above, the anodic alumina itself is typically unsuitable as a template for quantum wires, due to the lack of a systematic technique for controlling the diameter, a length and packing density of the pores in the anodic alumina.

It would, therefore, be desirable to provide a technique for fabricating an array of nanowires having a relatively small diameter, a relatively close spacing and a relatively long length. It would also be desirable to provide a technique for fabricating nanowires which does not depend upon the selection of chemical precursors. It would also be desirable to provide a technique which can be used to fabricate continuous wires having a relatively long length and which does not require high pressure injection of molten materials at relatively high temperatures. It would also be desirable to provide a template having pores therein with pore diameters which are relatively uniform. It would also be desirable to provide a technique for filling substrate pores having relatively small diameters. It would also be desirable to provide a technique for systematically controlling the pore diameter, pore length and center-to-center spacing of pores in an anodic aluminum oxide template.

SUMMARY OF THE INVENTION

In accordance with the present invention, an array of nanowires includes a substrate having a plurality of non-interconnected pores each of the pores having pore diameter which does not vary by more than one hundred percent and a material continuously filled in each of the plurality of pores of the substrate wherein the material has characteristic such that the material can become a quantum wire having a length not less than three microns. With this particular arrangement, an array of non-interconnected nanowires which can be used in a semiconductor device, an optical device or a thermoelectric device is provided. The substrate may, for example, be provided from a metal such as aluminum or an aluminum alloy in sheet or metal form having a surface layer of aluminum oxide thereon. Alternatively, the substrate may be provided from a mesoporous material such as a material from the silicate/aluminosilicate mesoporous molecular sieves. The material disposed in the pores may be provided as bismuth (Bi), or any other material capable of becoming a quantum wire. The substrate pores are provided having a wall composition or a surface property which reduces the contact angle between the material continuously filling the pores and the pore wall. Thus, the substrate pores can be filled utilizing relatively little, if any, pressure.

In accordance with a further aspect of the present invention, a method for providing a substrate having pores with walls having reduced contact angles includes the step of treating the pore wall with an acid solution to change at least one of a pore wall composition and a pore wall surface property. With this particular arrangement, a substrate having pores which can be filled without high pressure injection of a molten material at a relatively high temperature is provided. In one embodiment, the substrate is provided as an anodic aluminum oxide film, which is prepared by the anodic oxidation of aluminum in an acidic electrolyte. The electrolyte solution is selected to provide an anodic aluminum oxide film having a pore with a wall surface composition which is different than aluminum oxide. Thus, the pore wall composition or properties are modified during an anodization process. The modified pore walls result in a contact angle between the pore wall and a filling material which allows the pore to be continuously filled with a material without the use of high pressure injection techniques. Alternatively, the pore wall composition or surface properties may be modified after the anodizing process by applying a solution of $H_2SO_4$ to the pore wall to thus change the composition or surface properties of the pore walls to provide the pore walls having a contact angle which allows molten material to fill the pores without the use of high pressure injection techniques. Alternatively still, the composition or surface properties of the pore walls may be modified by depositing a desired surface species on the pore wall by a vapor deposition technique, for example. In another embodiment, the substrate is provide as mesoporous MCM-41. The pores in the mesoporous material may also be treated such that the contact angle between the pore walls and the material filling the pores allows the material to be drawn into the pores with little or no pressure.

In accordance with a still further aspect of the present invention a technique for fabricating nanowires includes the steps of treating the pores of an anodic aluminum oxide film to improve a contact angle of a pore wall, melting metal under vacuum and injecting the molten metal under pressure into the pores of the anodic aluminum oxide film to produce continuous nanowires. With this particular arrangement, a dense array of continuous nanowires having relatively small diameters which can be utilized in transport-related applications is provided. In one embodiment, the anodic aluminum oxide film has a plurality of pores formed therein and the technique is used to provide a dense array of nanowires. Thus, the process of the present invention can be utilized to generate large areas of highly regular and densely-packed nanowire arrays. Moreover, the process does not require clean room technology as is necessary for fabrication of quantum well superlattice systems. Therefore, a relatively simple and inexpensive technique for fabrication of densely-packed arrays of continuous nanowires is provided. Another advantage of this technique is that it can be applied to a wide range of materials including low melting temperature metals, alloys, semiconductors, and organic polymer gels and thus the technique is versatile. In one particular application an array of bismuth nanowires having average wire diameters as small as 13 nm, lengths of 30–50 $\mu$m, and a packing density greater than $4.6 \times 10^{10}$ cm$^{-2}$ is provided.

In accordance with still a further aspect of the present invention a method to systematically change the channel diameter and channel packing density of anodic aluminum oxide film includes the steps of anodizing an aluminum substrate with a particular one of a plurality of electrolytes at a predetermined voltage level, a predetermined temperature and a predetermined current and exposing pores in the anodized aluminum substrate to an acid which modifies either the composition or a surface property of a surface of the pore walls. With this particular arrangement, a systematic method for providing aluminum oxide film having particular characteristics is provided. The method can be used to provide, for example, an anodic aluminum oxide film having a particular pore diameter in the range of pore diameters extending from about 8 nm to about 200 nm. Moreover, with this technique, the pore diameters do not vary by more than one-hundred percent. Thus, with this technique, an anodic aluminum oxide film having an average pore diameter of 8 nm and having a desired channel length and structural regularity can be provided.

The solid-liquid surface tension $\gamma_{sl}$, depends on the surface properties of the solid in which the pores are formed and is not always small compared to the liquid-liquid surface tension $\gamma_{ll}$. By changing the composition or a surface property of the pore wall, a desired wall surface for individual liquids can be produced, thereby reducing the contact angle $\theta$. It has been recognized that in the pressure injection process, the contact angle $\theta$ plays an important role. Specifically, if the contact angle $\theta$ is less than 90°, the capillary pressure $4\gamma_{lv} \cos \theta/D$ is positive, so that this pressure itself is able to drive the liquid into the pores even when the pores are provided having a relatively small diameter. If the contact angle $\theta$ is greater than 90°, however, an external pressure higher than $-4\gamma_{lv} \cos \theta/D$ is needed. For an anodic alumina template the portion of alumina that is closed to the internal surface of the channels is contaminated by anions from the anodizing electrolyte. This means that solid-liquid surface tension $\gamma_{sl}$ depends on both the specific metal melt and the electrolyte type. Thus by appropriately selecting a suitable electrolyte the contact angle can be reduced and molten materials may be driven into pores having diameters at least as low as 8 nm with relatively low or no pressure. In one experiment, an anodic alumina template was prepared using a sulfuric acid solution and molten bismuth was successfully driven into pores with diameters as small as 13 nm at a pressure of 315 bar. The sulfuric acid electrolyte used for bismuth may also be appropriate for other molten metals. It is recognized, however, that the use of an anodizing electrolyte or a pore etching solution to adjust the pore wall composition or surface property may not be applicable to every molten material or even to every molten metal. If a suitable acid solution cannot be found for injecting a particular molten material of interest, a vapor deposition of a desired surface species before the pressure injection process may be performed in place of or in addition to, the use of an anodizing electrolyte or a pore etching solution to thus control the composition or surface properties of the pore wall to provide a pore wall surface which favors the interaction between the pore wall surface and molten material of interest. This technique allows the use of a modest pressure to drive a molten or liquid material into the pores and thus existing manufacturing and processing equipment can be used.

In accordance with a still further aspect of the present invention, a method to control the channel diameter of an anodic alumina film and the ratio of a pore diameter to the cell size during and after an anodizing process is described. With this particular technique, a method for controlling the pore structure of an anodic alumina film is produced. A vacuum melting and pressure injection process can be used to then fill an array of densely packed pores to thus generate continuous and dense nanowires useful in many electronic applications. Due to the high thermal and chemical stability of the anodic aluminum oxide film, the pressure injection process can be applied to other low melting temperature metals, semiconductors, alloys, and polymer gels. In one particular experiment an array of bismuth nanowires having an average diameter of about 13 nm, a length of about 30 $\mu$m and a $7.1 \times 10^{10}$ cm$^{-2}$ packing density was fabricated. Moreover, the individual wires were provided having a single crystal lattice structure.

The nanowire array composites fabricated in accordance with the techniques of the present invention find applicability in a wide range of fields including but not limited to use in electronic devices, photonics, high Tc superconductivity, thermoelectricity, chemical gas sensors and chemical gas separation. In particular, the 1D quantum wire systems find application in a wide range of technical fields of use.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Terminology

Before describing the processing and structures utilized to fabricate an array of nanowires, some introductory concepts in terminology are explained. As used herein, the term nanometer size range is used to describe a size range from about one nanometer to about 500 nanometers.

Quantum wires can be generally defined as including regions in which the charge carriers are quantum confined in two dimensions orthogonal to the axis of the wire. Quantum wire devices consist of a collection of particles each having a resonance cavity so small that quantum confinement effects are very pronounced. For the device to be effective, therefore, there must be a very high degree of size uniformity of the particles making up the quantum dot or quantum wire device so that each has substantially identical electronic and optical properties.

Quantum wire devices provide the building blocks for digital nanoelectronic circuits which refer to an integrated circuit technology which permits down scaling to be carried beyond to what is currently achievable. Quantum wire devices also provide the basic structure for thermoelectric devices.

Figure 1:
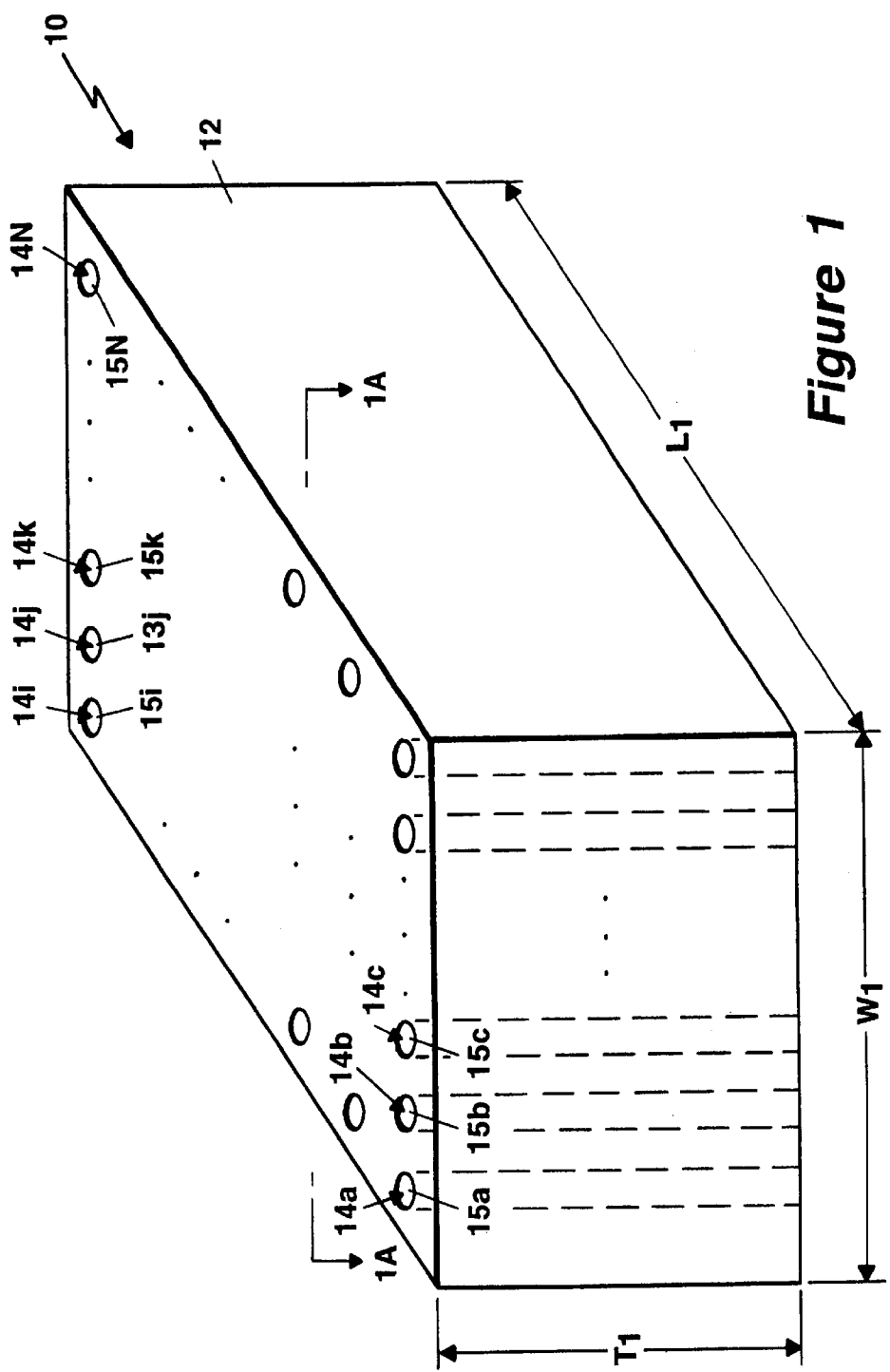
FIG. 1 is a highly diagrammatical view of a substrate having a plurality of pores therein.
Figure 1A:
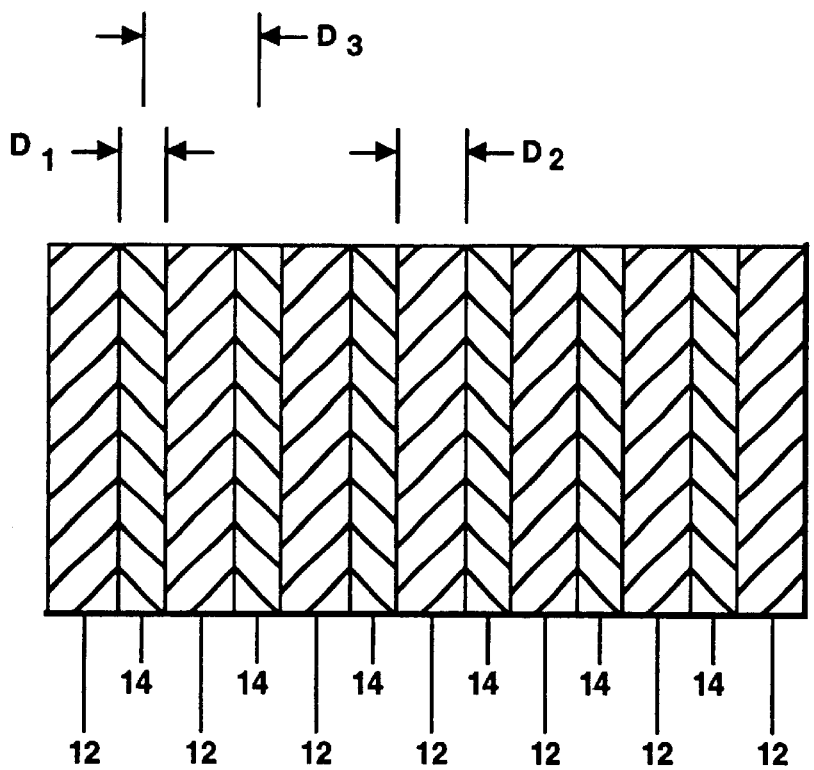
FIG. 1A is a cross-sectional view taken through lines 1A—1A in FIG. 1.

Referring now to FIG. 1, an array of nanowires 10 includes a substrate 12 having a length L$_1$, a width W$_1$ and a thickness T$_1$. Substrate 12 is provided having a plurality of non-interconnected pores 14a–14n generally denoted 14. The pores 14 are non-interconnected in the sense that the pores 14 do not contain apertures or openings to any other of the pores 14. For example pore 14a does not contain any opening or aperture through which material could move into pore 14b. Each of the pores are continuously filled with a material which provides a corresponding nanowire 15a–15n generally denoted 15.

In this particular embodiment, each of the wires 15 are provided having a diameter in the range of about 80 angstroms (Å) to about 300 nanometers (nm) with the diameter of any single wire and thus any single pore 14 not varying by more than one hundred percent along the length of the wire. In a preferred embodiment, substrate 12 may be provided from any one of a plurality of materials having a plurality of pores therein. For example, substrate 12 may be provided as an anodic aluminum oxide film. As is known, porous anodic alumina has an array of hexagonally packed nanometer-sized pores. As will be described in detail herein below, certain processing steps can be performed to tailor the diameter, length and packing density of the pores in the anodic aluminum oxide film. The substrate is preferable provided having a thickness in the range of about 200 nm to about fifty micrometers ($\mu$m). Anodic aluminum oxide film is desirable because of its geometry and also because its wide band gap energy and low thermal conductivity (<4 watt·cm$^{-1}$ K$^{-1}$) are desirable when the anodic aluminum oxide film acts as a template for quantum wire systems of interest for electronic or optical applications.

Alternatively, substrate 12 may be provided from a mesoporous material such as mesoporous silica also having a thickness in the range of about 200 nm to about fifty microns. Mesoporous material may be provided, for example, as MCM-41. Alternatively still substrate 12 raay be formed from an array of glass nanotubes or from an organic matrix.

Regardless of the particular substrate material, nanowires 15 are provided by continuously filling the pores 14 in the substrate 12 with a preferred material. The particular material with which pores 14 are filled may be selected in accordance with a variety of factors including but not limited to the particular application for which the nanowire array will be used. For example, when the array of wires 15 are to be used in a thermoelectric device, then it is desirable to provide the wires from a material such as bismuth (Bi). Alternatively, when it is desirable to use an array of nanowires 14 in a superconductivity, electronic, optical or chemical gas application it may be preferable to form the nanowire array from materials other than Bi. Those of ordinary skill in the art will appreciate and recognize how to select a particular material for a particular application.

After providing substrate 12 having a plurality of noninterconnected pores 14 with average diameters less than nine nanometers and diameter variations of less than one hundred percent, the pores may be filled with a material using one of a variety of filling techniques. One particular technique for providing a substrate having an array of regularly spaced pores which may also have relatively small pore diameters will be described herein below. With respect to filling techniques the pores may be filled with a material using an evacuation and pressure filling technique to be described below or alternatively the pores may be filled using an electro deposition technique or a vapor deposition technique including a chemical vapor deposition technique. Prior to filling the pores, however, the pore walls are treated to such that the contact angle between the pore wall and the filling material is reduced.

Figure 2:
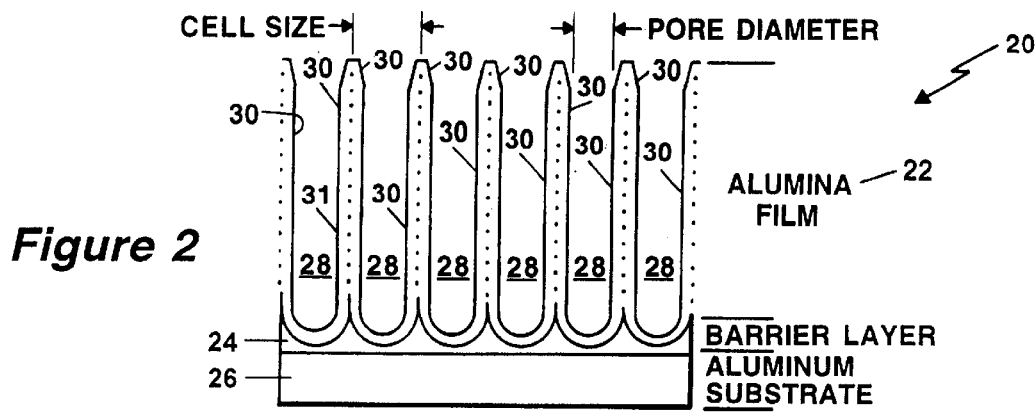
FIGS. 2, 2A, and 2B are a series of diagrams illustrating the steps in the fabrication of a metal nanowire array composite.

Referring now to FIG. 2, a porous substrate 20 includes an anodic aluminum oxide film 22 disposed over a barrier layer 24 on top of an aluminum carrier 26. Anodic aluminum oxide film 22 has a plurality of pores 28 provided therein. Pores 28 are a result of the anodizing process and in this particular embodiment, have a diameter typically in the range of about eight to about one hundred nanometers with a diameter of variation along a length of the pore of no more than one hundred percent and preferably no more than fifty percent and even more preferably no more than twenty percent. Pores 28 are separated by barrier walls 30 and are separated from carrier 26 by a barrier layer 24.

Figure 2A:
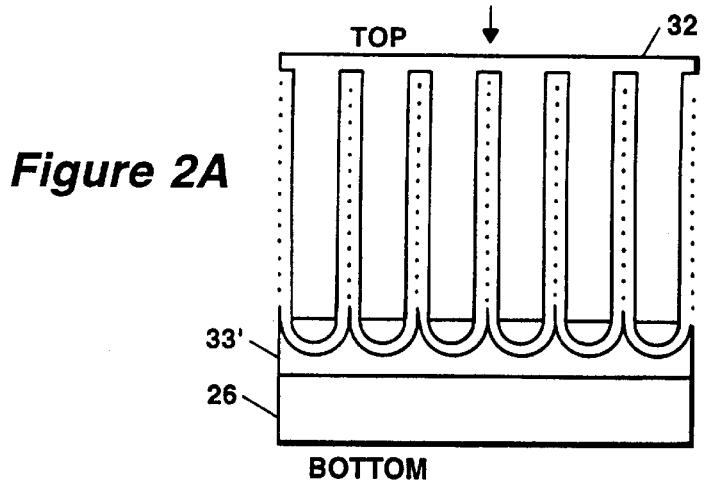
Figure 2B:
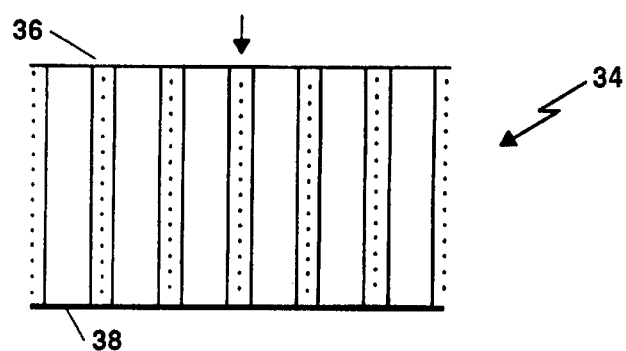

Referring now to FIG. 2A, a pore filling material which may, for example, be provided as a metal such as bismuth (Bi) 32 continuously fills a predetermined region in each of the pores 28. A portion of the filling material 32 merges with barrier layer 24. The layer 33 and carrier 26 are then removed in a manner to be described below to provide an array of nanowires 34 as shown in FIG. 2B. Nanowire array 34 is provided from a plurality of walls 36 which define openings in the substrate. The openings are filled with the wire material 38. Thus an array of equally spaced wires 38 each having a substantially constant diameter is provided.

EXAMPLE

An aluminum substrate was used in the fabrication of an array of bismuth nanowires using a preferred process of the present invention. First, an aluminum substrate was prepared in the following manner.

In one particular embodiment, to provide the an anodic aluminum oxide film such as film 22 described above in conjunction with FIG. 2, an aluminum (Al) foil having a purity of about 99.997% was divided into a plurality of pieces of predetermined shape. The Al foil may be provide as commercially available Al foil of the type, provided for example, from Alfa AESAR and cut into pieces having a rectangular shape with a length typically of about 25 millimeter (mm) and a width typically of about 10 mm. Those of ordinary skill in the art will appreciate of course that the Al foil may be provided having a shape other than rectangular and may be provided any length, width or diameter appropriately selected for a particular application and that it is not a necessary to the invention that the Al foil be provided in sheet form.

In the case where Al foil is used, the Al foil are flattened. This may be accomplished, for example, by pressing the foil to a flat aluminum substrate using a cold press apparatus. The Al foil is pressed to the substrate , operating at a pressure of about 1.7×10$^3$ bar.

The next step is to polish the foil. The foil may be polished using a combination of mechanical and electrochemical polishing techniques. Mechanical polishing may be accomplished using, for example, a three micron diamond paste and then using Mastermate. The mechanically polished foil normally has a shiny finish, but it is not perfect over the whole surface. After mechanical polishing, the foil is washed in acetone and sonicated for a time typically of about thirty minutes. The foil is then air dried. It should be noted that if the foil is initially provided as a flat foil having a relatively smooth substrate, the above-described flattening and mechanical polishing steps may be omitted and processing of the foil begins by electrochemical polishing of the Al foil.

Prior to the electrochemical polishing step, the substrate is calcined in air at a temperature typically of about 350° C. for a time of approximately thirty minutes to provide the substrate having a substantially uniform surface oxide layer. Next the foil is electrochemically polished. The step of electrochemical polishing includes the steps of placing the aluminum substrate in an electrolyte provided from an acid solution, providing the aluminum substrate as an anode, providing a cathode and applying a voltage in a predetermined voltage range.

Figure 3:
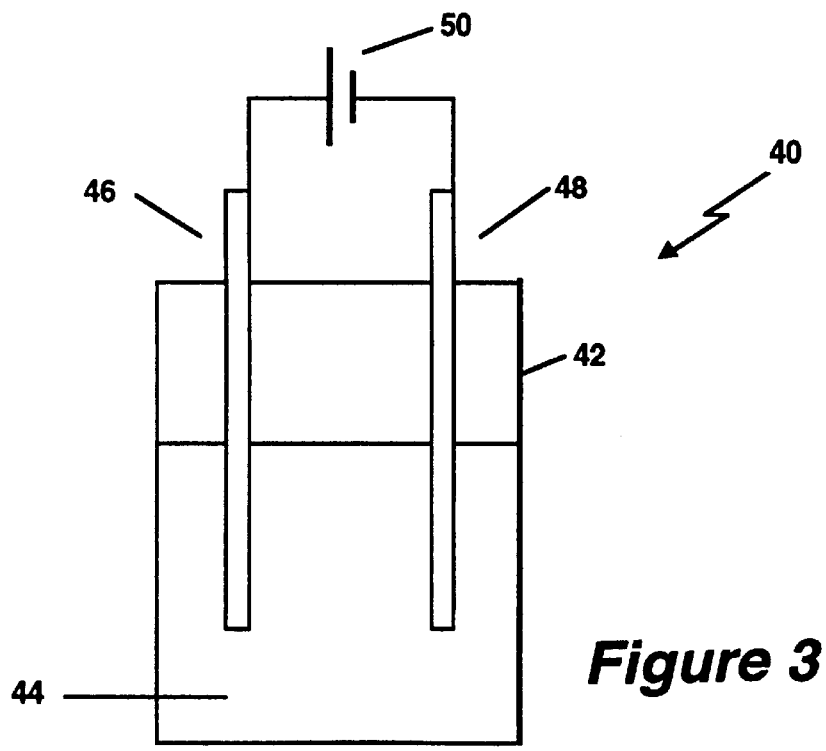
FIG. 3 is a block diagram of a system for anodizing and electrochemical polishing a substrate.

Referring briefly to FIG. 3, an apparatus for polishing the foil includes a container 42 having a mixed solution of acids as the electrolyte disposed therein. The electrolyte solution is appropriately selected for electrochemical polishing of the foil. For example, the composition of the acid solution may be provided as: 95 vol % phosphoric acid solution (85 wt %)+5 vol % sulfuric acid solution (97 wt %)+20 g/l chromium oxide (CrO$_3$).

The temperature of the electrolyte is maintained at a temperature of about 85° C. The Al film serves as an anode 46 and a Pt foil or a graphite electrode may be used to provide a cathode 48. A power supply 50 provides a substantially constant voltage in the range of about 20 V to about 24 V during the polishing. The polishing time is controlled to be between about one minute to about three minutes depending upon the original surface roughness of the foil 46.

After polishing, the foil 46 is removed from the electrolyte 44, washed with de-ionized water, and then dried in air. The substrate 46 is next de-smudged in a chromic acid solution ($CrO_3$: 45 g/l, $H_3PO_4$ 3.5 vol %) at a temperature of about 95° C. for several minutes to dissolve the surface oxide on the substrate 46 immediately before the anodizing process. The substrate 46 is then washed again with de-ionized water and dried in flowing air. The surface of the Al substrate 46 normally has a relatively smooth finish after the electrochemical process.

It should be recognized that other electrochemical techniques, well known to those of ordinary skill in the art may also be used to provide the Al film having an appropriately smooth surface finish.

After preparing the Al film as discussed above, the film is subject to an anodizing process. In the anodizing process. a strong acid solution is preferably used as the electrolyte. Depending upon desired channel diameters and wall compositions of the anodic alumina films, one of three types of electrolytes ($H_2SO_4$ solution, oxalic acid ($H_2C_2O_4$) solution, and $H_3PO_4$ solution) may be used.

When a solution of $H_2SO_4$ is used as the electrolyte, the solution is provided having a weight of $H_2SO_4$ in the range of about 5% to about 40% or in the range of about 1% to about 20% and preferably a weight of $H_2SO_4$ in the range of about 15% to about 20%. Typically, when it is desirable to provide an anodic alumina film haliing pore diameters 30 nm or less and relatively small cell sizes are desired or required, a solution having a weight of $H_2SO_4$ in the range of about 15% to about 20% is preferably used as the electrolyte.

When a solution of $H_2C_2O_4$ is used as the electrolyte, the solution is provided having a weight of $H_2C_2O_4$ in the range of about 1% to about 8% and preferably a weight of $H_2SO_4$ in the range of about 3% to about 5%. Typically, when it is desirable to provide an anodic aluminum oxide film having pore diameters in the range of about 30 nm to about 80 nm, a solution of having a weight of $H_2C_2O_4$ of about 4% is preferably used as the electrolyte.

When a solution of $H_3PO_4$ is used as the electrolyte, the solution is provided having a weight of $H_3PO_4$ in the range of about 1% to about 40% and preferably a weight of $H_2SO_4$ in the range of about 4% to about 8%. Typically, when it is desirable to provide an anodic aluminum oxide film having pore diameters in the range of about 80 nm to about 200 nm, a solution of 4–8 wt % $H_3PO_4$ is preferably used as the electrolyte.

The portion of anodic aluminum oxide film surrounding the pores (i.e. the pore wall surfaces) are contaminated by anions from the electrolyte and it has been recognized that changing the electrolyte type can change the composition of the pore wall. Thus, the composition of the anodic aluminum oxide film, and in particular the pore wall surfaces of the anodic aluminum oxide film may be important. Thus, the $H_2C_2O_4$ solution can be used to prepare anodic alumina filmns having pores with diameters smaller than 20 nm, and the $H_3PO_4$ solution can be useid to prepare anodic alumina films having pores with diameters as small as 30 nm.

Next, the Al film is anodized under constant voltage conditions. It has been found that using constant voltage conditions in the anodizing process results in the repeated generation of anodic aluminum oxide films having a relatively regular array of pores. The voltage determines the cell size of the film. All three electrolytes were found to obey the following empirically derived equation:

$$C=mV$$

in which:

C is the cell size in nanometers;

V is the anodizing voltage in volts; and m is a constant in the range of 2.0 to 2.5.

For a solution of $H_2SO_4$, a voltage in the range of about 5 volts to about 30 volts may be used. If the solution is provided having a weight of $H_2SO_4$ in the range of about 15% to about 20% a voltage in the range of about 13 volts to about 25 volts is preferably used. If the voltage is selected to be higher than 30 volts, a relatively high current flow results which further results in generation of an anodic aluminum oxide film which does not have a suitably uniform structure. If the voltage is lower than about 5 volts, a relatively low current flow results which also results in generation of an anodic aluminum oxide film which does not have a suitably uniform structure.

For a solution of $H_2C_2O_4$ a voltage in the range of about 5 volts to about 120 volts may be used. For a solution of having a weight of $H_2C_2O_4$ of about 4%, a voltage between 30 to 60 is preferred.

For a solution of $H_3PO_4$, a voltage in the range of about 5 volts to about 200 volts may be used. For a solution having a weight of $H_3PO_4$ in the range of about 4% to about 8%, a voltage in the range of about 15 volts to about 120 volts can be applied depending on the actual acid concentration. Typically, however, to generate a reasonable anodizing current, a voltage higher than 25 volts may be needed. It was found that higher anodizing voltages within the operating range typically generate better pore structures for all three electrolytes that were employed.

In the anodizing process, the current plays an important role in generating films with a regular structure. Normally a current in the range of 1 to 200 $mA/cm^2$ and preferably between 1 to 80 $mA/cm^2$ and even more preferably between 5 to 40 $mA/cm^2$ of substrate surface is desired. If the current is too large, the film will grow very fast and the structure that is generated is not uniform. If the current is too small, the film growth will be very slow and a very long anodizing time is necessary to generate a film with the desired thickness. The anodizing current depends on the selected voltage, electrolyte type and electrolyte temperature the electrolyte temperature can be in the range of about −5° C. to about 50° C.

The electrolyte concentration is another important parameter in controlling the film growth. Relatively high electrolyte concentrations increase the anodizing current for the same anodizing voltage. Higher concentrations generally favor slightly larger pore diameters even though this effect was not very significant for all three of the electrolytes.

The electrolyte temperature is also an important parameter in controlling film growth. First, the activity of the acid strongly depends on the temperature. For an $H_2SO_4$ solution, the pore diameter of an anodic aluminum oxide film is dependent on the electrolyte temperature. For very low temperature, e.g. 0° C., a very small pore diameter will be generated. The pore diameter increases with increasing temperature. A suitable electrolyte temperature range is 0–10° C. A similar behavior was observed for the $H_2C_2O_4$ solution. Since the pore diameter generated with $H_2C_2O_4$ is normally larger than that with $H_2SO_4$, the influence of the electrolyte concentration was not that important. Second, the electrolyte temperature affects the anodizing current. For all three electrolytes, the current increases slightly when the temperature increases. So the temperature of the electrolyte is a useful processing parameter to control both the film growth rate and the ratio of the channel diameter to the cell size.

Many anodic aluminum oxide films prepared as described above did not have a smooth channel wall surface. It is desirable, however to provide pores having relatively smooth pore wall surfaces since this may facilitate filling the pores with a liquid using a filling technique such as the injection technique to be described below in conduction with the step of filling the pores with a liquid metal. The channel diameter can be adjusted by etching with an acid solution. The final channel diameter of the film depends on both the composition of the etching solution and the etching time. The 4–5 wt % $H_3PO_4$ solution is a widely used etching solution and is also an efficient etching solution. Another etching solution which used in this experiment was a solution of 20 wt % $H_2SO_4$, which was found to work much slower than the 4–5 wt % $H_3PO_4$ solution.

In this experiment, it was discovered that the surface properties of the channel wall could be strongly affected by the acid etching. When pore enlargement was performed using the $H_3PO_4$ solution for films prepared with a solution of 20 wt % $H_2SO_4$ as the electrolyte, it was very difficult to drive molten Bi into the channels at a pressure of 315 bar. When pore enlargement of the same film was performed using a $H_2SO_4$ solution, however, molten Bi was driven into the small channels at the same pressure of 315 bar even though the former film actually had a slightly larger average channel diameter.

It is believed that the anions from the etching solution changed the composition of the channel walls, which was a gel-like material in the as-prepared anodic alumina films. For films prepared by the $H_2C_2O_4$ solution, the pore enlargement process was performed according to the following sequence: first the film was dipped into the $H_3PO_4$ solution to generate the desired channel diameter, then it was washed in de-ionized water and dipped into the $H_2SO_4$ solution to change the surface properties of the channel.

The pores were filled with a wire material using a vacuum melting and pressure injection processes next described. In order to stabilize the film structure, the anodic alumina films were first calcined at 350° C. for 1 hour in air. The small channels of the host film were then filled with Bi metal by the vacuum melting and high pressure injection processes. The low melting temperature of Bi ($T_m$=271.5° C.) and the high thermal stability (up to 800° C.) and high rigidity of the anodic alumina film make these processes possible.

Figure 4:
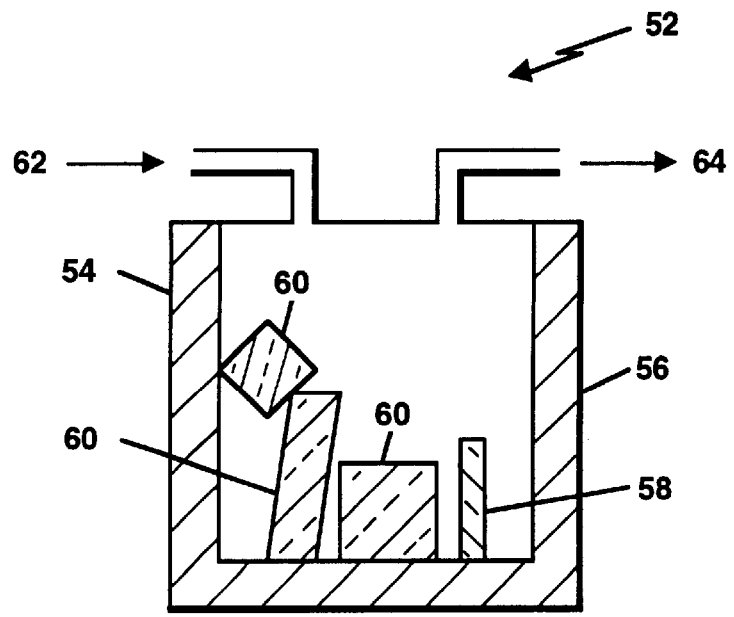
FIG. 4 is a schematic diagram of a system for the vacuum melting and pressure injection of molten metal into the pores of a substrate.

As may be seen with reference to FIG. 4, the porous film, which was kept on the aluminum substrate, was placed inside a high pressure reactor chamber and surrounded by high-purity Bi pieces. The reactor chamber was first evacuated to pressure of about $10^{-2}$ mbar and heated to a temperature slightly lower than the melting temperature $T_m$ of Bi to degas the porous film.

The chamber was then heated to a predetermined temperature at a ramp rate of 2° C./min heating rate. In this particular example, the predetermined temperature was selected to be about 250° C. A temperature soak at 250° C. for 3 hours were found to be sufficient to accomplish the goal of degassing the porous film.

After the film was fully degassed, the temperature of the reactor was increased above the $T_m$ of Bi, and a temperature of 325° C. was used in the experiments. The higher temperature above $T_m$ helped to slightly reduce both the surface tension and the viscosity of the molten metal. High pressure argon gas was introduced into the reactor chamber to drive the molten Bi into the evacuated channels. The injection time was found to depend on the pressure, channel length, surface properties of the channel wall, and the individual liquid. In these experiments, 3 to 8 hours were used for the injection time.

After the injection was completed, the reactor was slowly cooled down to room temperature, normally at a cooling rate of 0.5–1° C./min in these experiments. The impregnated Bi was allowed to solidify and to crystallize inside the nanochannels. The slow cooling was found to be important for generating single crystal Bi nanowires. Finally the pressure was slowly released.

Referring briefly to FIG. 4, apparatus 52 effective for performing the above described vacuum melting and pressure injection of a material, such as Bi for example, into pores of a substrate such as an anodic aluminum oxide film, includes a chamber 54. Chamber 54 may be provided as at high pressure chamber (which also serves as a vacuum chamber) having a heater 56 coupled thereto. A sample 58 is disposed in chamber 54 and is surrounded by material 60 to be injected into a porous surface of the sample 58 the molten material is provided from a material having a melting temperature lower than a temperature at which the substrate undergoes a structural change.

Means 62 for pressuring chamber 54 is here provided by from a gas source which in one particular embodiment may be provided as source of pressurized gas such as argon (Ar) gas and in particular an argon gas tank capable of providing a pressure of about 6000 pounds per square inch. Also coupled to chamber 54 is a means 64 for generating a vacuum within chamber 54. In one particular embodiment, means 64 includes a vacuum pump for evacuating the chamber 54 to a level of about $10^{-2}$ torr. Apparatus 52 may be provided for example as a commercially available high pressure reactor. In general overview, apparatus 52 is operated in a manner similar to that described above to inject a desired material into the pores of the sample 58.

As for the wetting process, in one experiment in which molten Bi was injected into tile anodic aluminum oxide film prepared by a $H_2SO_4$ solution at a pressure of about only 10 bar. It is possible that the contact angle between the liquid Bi and the channel walls was such that the capillary pressure itself was able to drive the liquid Bi into the small nanochannels. In another experiment, pore enlargement was performed using 4 wt % $H_3PO_4$ solution for the anodic alumina prepared by an $H_2SO_4$ solution, and the average channel diameter of the film after pore enlargement was 35 nm. However, the molten Bi melt was not be able to be injected into the 35 nm channels of the $H_3PO_4$ solution etched film at the same pressure (315 bar) at which we filled the 13 nm channels. This indicated the importance of the wetting processes used to modify the composition or a surface property of a pore wall to provide a contact angle which allows injection of a liquid metal at relatively low injection pressure.

After the liquid Bi was injected into the pores of the anodic aluminum oxide film, the processed film (sometimes referred to hereinbelow as a "sample") was mechanically extracted from the metal piece. Since the porous film remained on the Al carrier during the processing, it was not difficult to separate the sample from the Bi metal. Normally there was a crack between the film and the metal piece. This crack is believed to be due to the incompatibility of the thermal expansion rate between the anodic alumina and the Bi during the cooling process.

When a shear force was applied between the sample and the Bi metal, the sample separated from the metal piece as a whole. Most of the time, there were no Bi metal pieces attached to the film surface after separation. After the sample was extracted from the metal piece, the Al substrate wvas etched away by an amalgamation process. Here, a 0.2 M mercuric chloride ($HgCl_2$) solution was used. It was observed that a thin layer of Bi (e.g. layer 33 in FIG. 2A) existed between the film and the Al carrier after the Al carrier was removed.

The Bi layer 33 (FIG. 2A) was polished away mechanically using 50 nm $\gamma$-$Al_2O_3$ particles, which were found to be a good polishing agent for this process, since 50 nm $\gamma$-$Al_2O_3$ particles has almost the same hardness as the anodic alumina film and did not damage the film structure. After the polishing process, the film was put on a glass slide using molten paraffm with the upper surface of the anodic alumina film facing the glass slide so that it could be protected by the solidified paraffin. The glass slide was then dipped into a 4 wt % $H_3PO_4$ solution to dissolve the barrier layer. The etching time depended on the thickness of the barrier layer h which is proportional to the anodizing voltage V, through the empirical relation: h(nm)$\approx$V(volts). The etching rate was about 1 nm/minute. It was found that there was a short distance between the end of the majority of Bi wires and the backside surface of the original film (see FIG. 2A), and this distance is attributed to the shrinkage of the Bi during the liquid to solid phase transition. This empty portion of the channels can be easily removed by chemical etching or mechanical polishing. A schematic of the final composite structure is shown in FIG. 2B.

The anodic alumina film was evaluated using a high resolution scanning electron microscope (SEM JOEL 6320) and a transmission electron microscope (TEM, JOEL 20OCX). Ion milling (6 keV argon ion) was used to thin the film to a thickness less than 100 nm so that a TEM picture of the film could be taken. The Bi filled anodic alumina film was characterized by X-ray diffraction (XRD) using a Siemens D5000 diffractometer (45 kV-40 mA, Cu-K$\alpha$). The Bi nanowires were evaluated by SEM. The band gap energy of the Bi nanowires was determined by taking optical transmission spectra of the composite films using an UV-Visible-IR spectrophotometer.

FIGS. 5–10 are a series of images produced using SEM and TEM to show the structure of the substrates and nanowire arrays fabricated in accordance with the techniques of the present invention.

Figure 5:
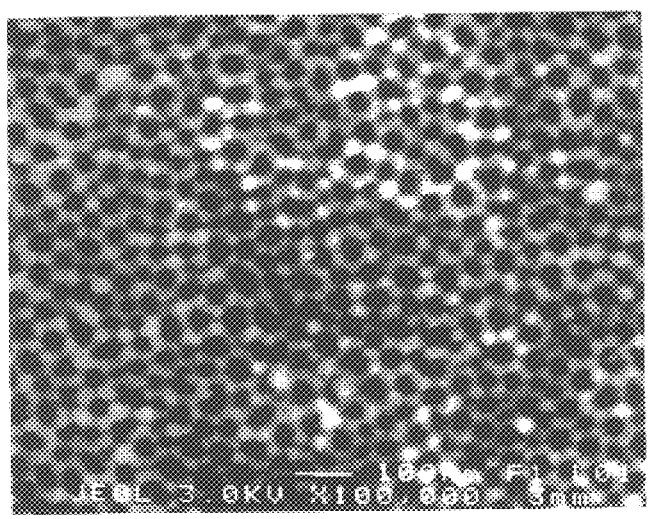
FIGS. 5, 5A, and 5B are a series of images generated with a scanning electron microscope (SEM) of the topside surface of an anodic aluminum oxide film prepared by a 20 wt % H$_2$SO$_4$ solution at 20V (FIGS. 5 and 5A) and 15V (FIG. 5B)
Figure 5A:
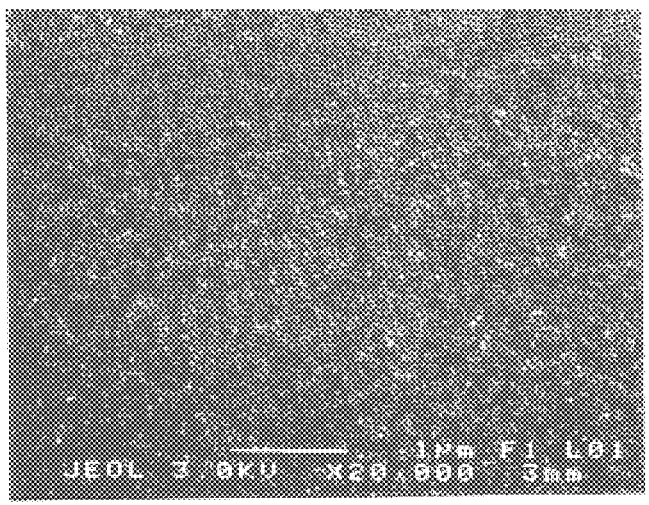
Figure 5B:
Figure 6:
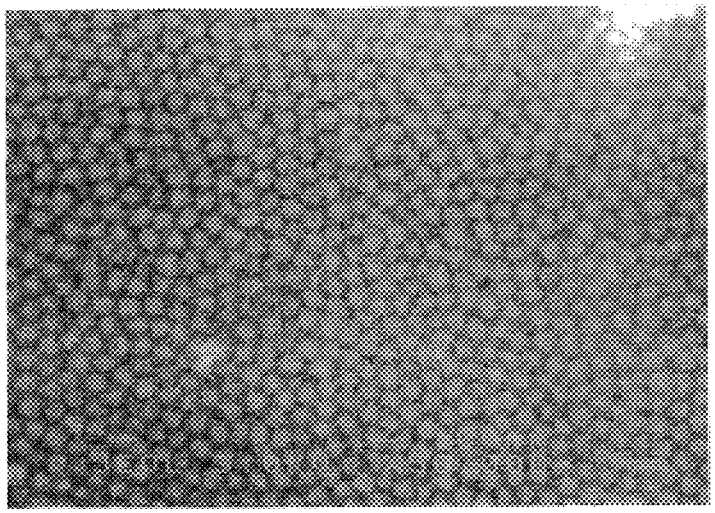
FIG. 6 is an SEM image of a backside surface of an anodic aluminum oxide film taken before removal of a barrier layer.
Figure 6A:
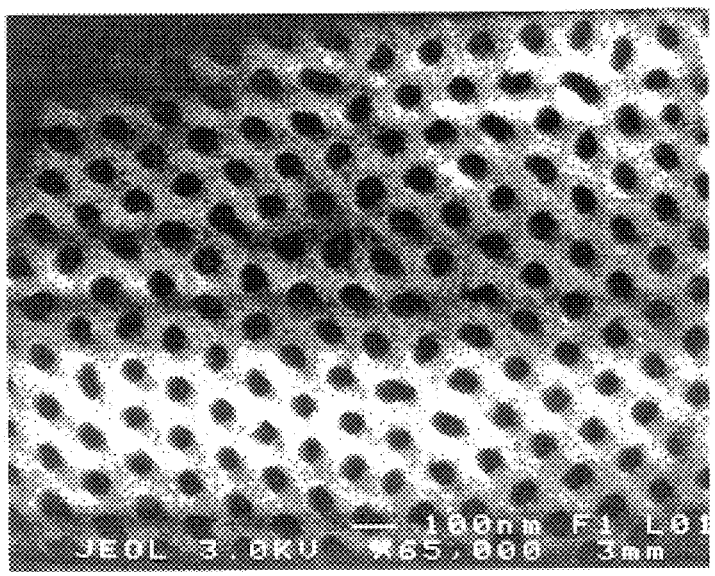
FIG. 6A is an SEM image of a backside surface of an anodic aluminum oxide film after removal of a barrier layer.

Referring now to FIGS. 5–5B, SEM images of the surface of the anodic alumina film are shown. SEM provides a very efficient tool for evaluating the surface features of the anodic alumina film. Since the film is insulating, the film was coated with a thin layer of Au/Pd before the SEM experiment, which helped to get high resolution images. It was found that the average diameter of the channel entrances was slightly larger than the expected value (there were empirical relations between the average channel diameters and the anodizing voltages in the literature). This is consistent with previous results in the literature. SEM was also used to evaluate the backside of the film after the barrier layer was removed. The regularity of the pore structure on the backside of the film was found to be better than the topside surface, Some of the SEM images of the film backside are presented in FIGS. 6 and 6A. The film thickness was also determined from SEM images.

In order to get more accurate data on the channel size distributions of the anodic alumina films, the films were thinned from both sides by Ar ion milling (argon ions at 6 KeV). The pore structure of the film was then evaluated by TEM. This gave us an image of the cross section of the film, and a more faithful pore size distribution than SEM images because the channel entrances normally have different diameters from the majority of channel lengths inside the film.

Figure 7:
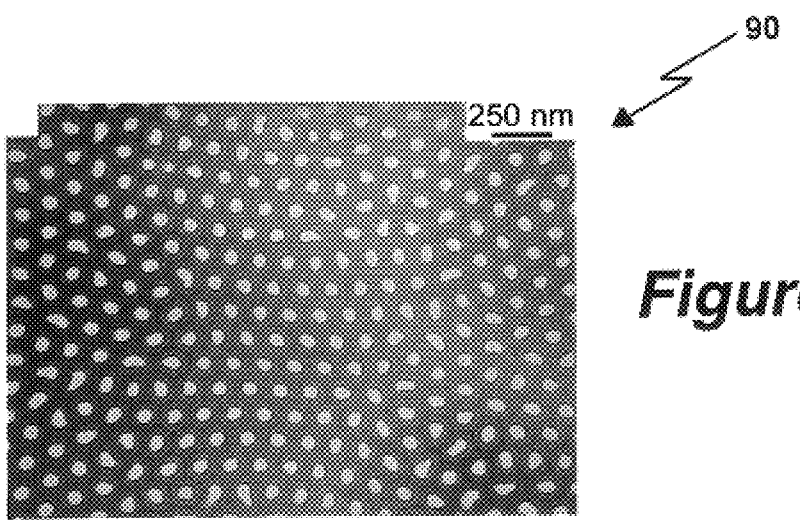
FIGS. 7, 7A, and 7B are a series of images taken with a transmission electron microscope (TEM) of a cross-section of an anodic aluminum oxide film after ion milling.
Figure 7A:
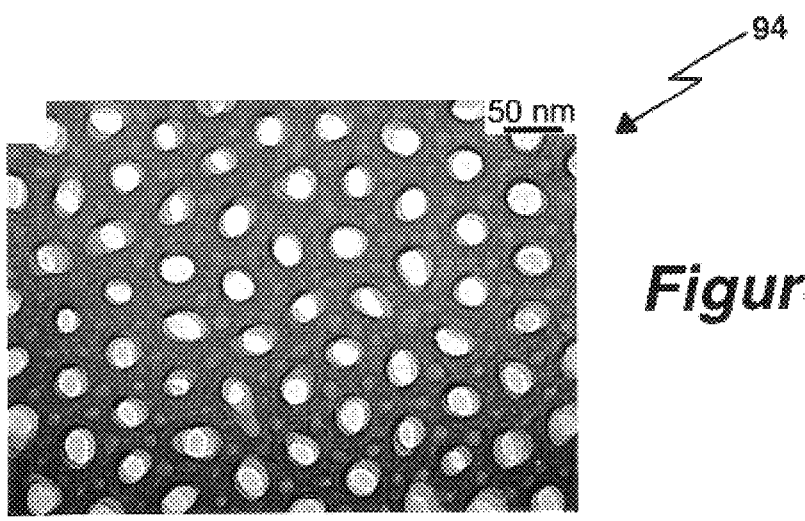
Figure 7B:
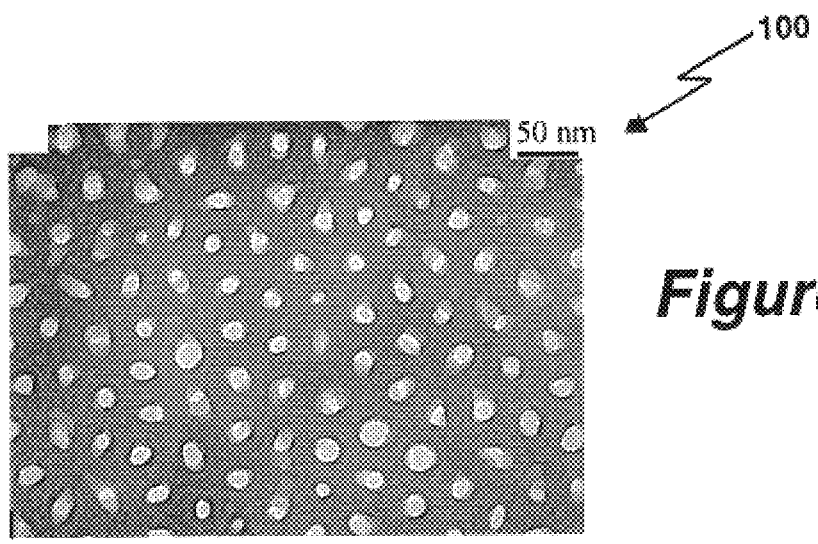

Shown in FIGS. 7–7B are TEM images of anodic alumina films with average channel diameters of 56, 23, and 13 nm and channel densities of $7.4\times10^9$. $4.6\times10^{10}$ and $7.1\times10^{10}$ $cm^2$, respectively.

Figure 7C:
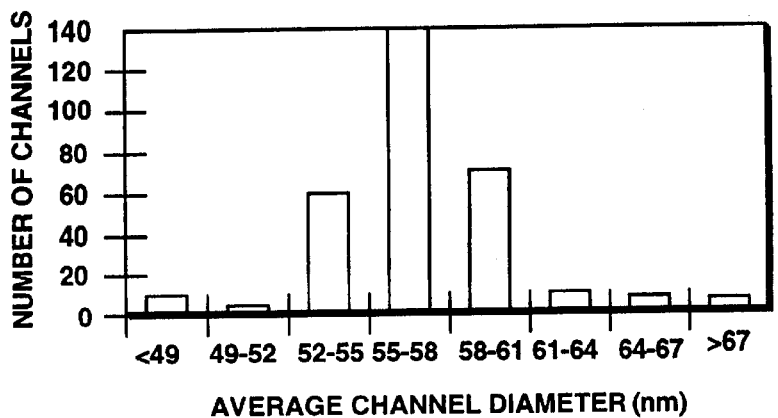
FIG. 7C is a plot of the number of pores versus average pore diameter for the anodic aluminum oxide film of FIG. 7.
Figure 7D:
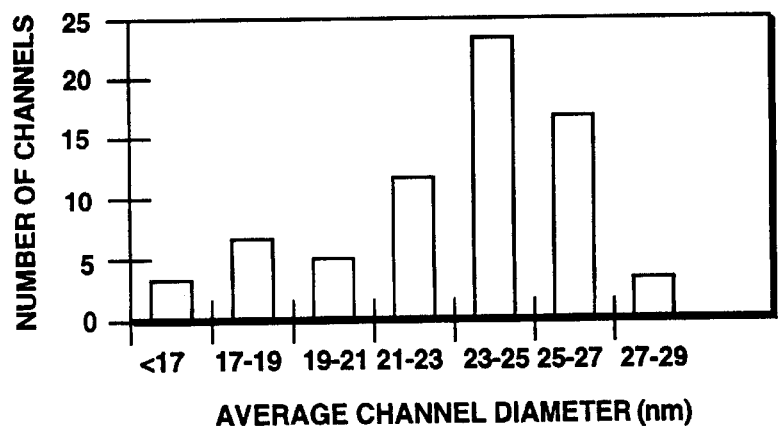
FIG. 7D is a plot of the number of pores versus average pore diameter for the anodic aluminum oxide film of FIG. 7A.
Figure 7E:
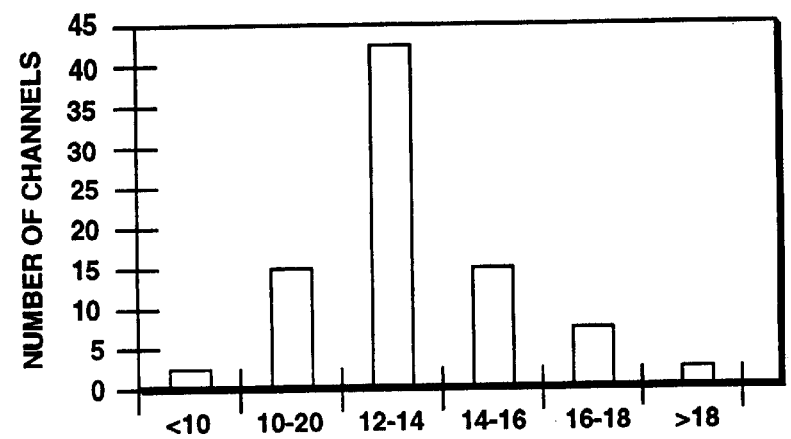
FIG. 7E is a plot of the number of pores versus average pore diameter for the anodic aluminum oxide film of FIG. 7B.

FIGS. 7C–7E, show the distributions of the average channel diameter of these films, we can see that the anodic alumina films which we made have a highly regular structure and a narrow channel size distribution. The channel diameters determined in this method were normally smaller than the diameters of the channel entrances which were determined by SEM images of the film surface.

The crystalline structure of the Bi nanowire array composites were studied by X-ray diffraction. Before the XRD experiment, the Bi filled films were first extracted from the Al substrate. Then the alumina barrier layer on the backside of the film was removed, which helped to assure that there were no contributions to the diffraction pattern from Bi particles stuck to the surface of the film. The films were then put on a glass slide using paraffm.

Figure 10:
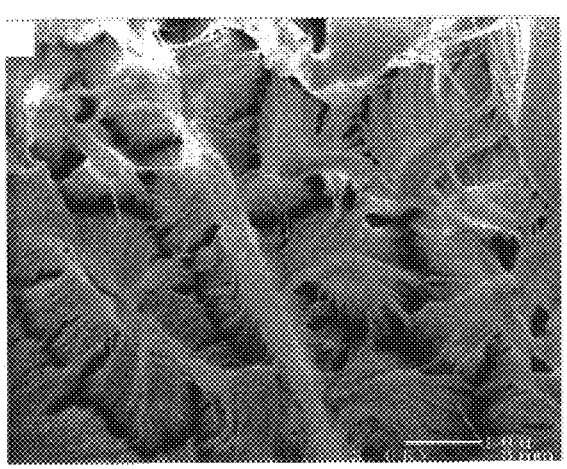
FIGS. 10, 10A, and 10B are a series cpf SEM im ages of metal nanowires after the anodic aluminum oxide m was partially dissolved from a bottom surface of the film.
Figure 10A:
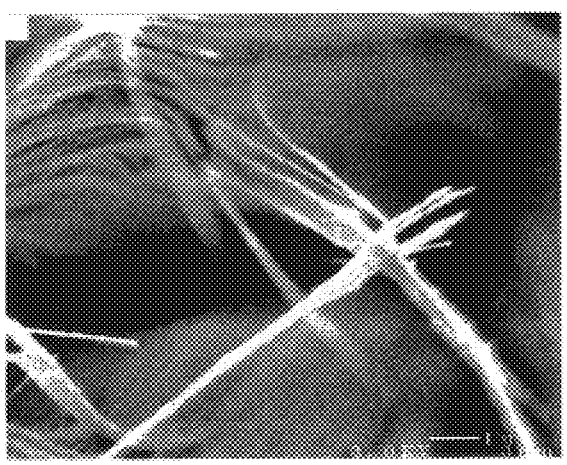
Figure 10B:
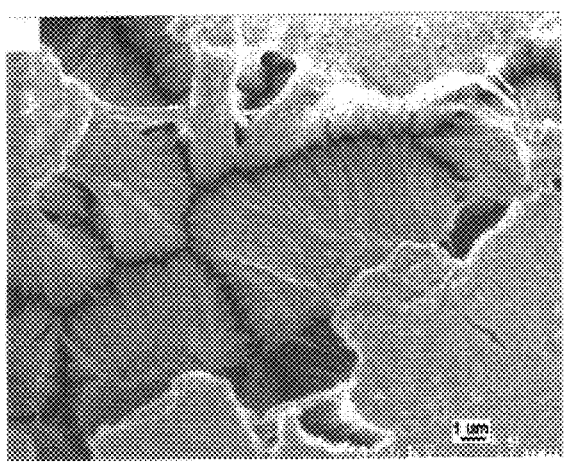

FIGS. 10–10B show SEM images of Bi filled films with 23 (FIGS. 10–10A) and 13 (FIG. 10B) nm channel diameters, respectively, after partially dissolving the alumina matrix from the backside of the film. The portion of nanowires without support tend to agglomerate with each other, as shown in FIGS. 10–10B, and making it difficult to resolve the individual wires. The fine Bi wires were amazingly ductile (we observed from the SEM images that some wires were bent by angles larger than 90°) although the bulk Bi is very brittle. This also indicated a good crystallinity of the ultra-fine Bi wires. Since the whisker-like features shown in FIG. 10–10B were observed throughout the whole film, we concluded that the porous film has been thoroughly filled by Bi.

The electronic states of a Bi nanowire array composites studied by optical transmission spectroscopy. The piorous alumina film, which is clear and transparent originally, changed color after it was filled with Bi, with a color that depends on the pore diameter of the original template, i.e., depending on the diameter of the Bi nanowire. Thus the 56 nm sample is dark, while the 23 nm sample is yellowish and the 13 nm sample is essentially transparent. This kind of color change indicates a dramatic change in the band gap energy of the Bi nanowire as a function of wire diameter. This color change is consistent with an estimate of about 45 nmn for the diameter at which the Bi nanowire makes a transition from a semimetal to a 1D semiconductor. In order to determine the band gap energy of the Bi nanowire composite, we studied its optical transmission properties using an UV-Visible-IR spectrophotometer. In carrying out the optical transmission experiment, the samples were put between two glass slides. The spectrophotometer was operated in the double beam mode and the incident beams were perpendicular to the film.

Figure 11:
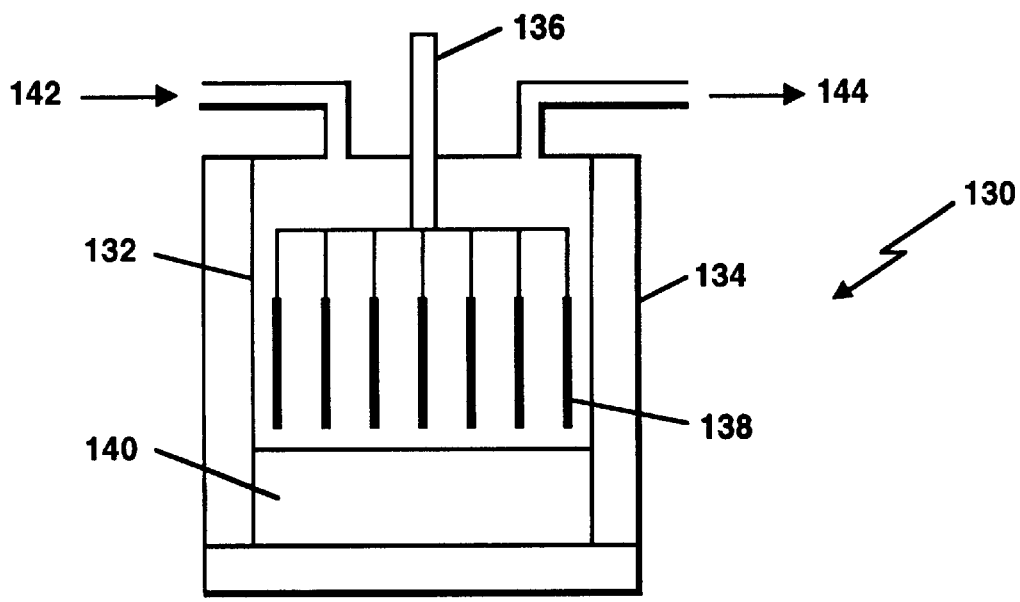
FIG. 11 is a schematic diagram of a system for fabricating nanowires.

Referring now to FIG. 11, the vacuum melting and pressure injection apparatus presently used has several drawbacks which can be improved for scale up production. The first drawback is the low production rate. The second is the method of extracting the sample from the solidified metal piece.

An apparatus 130 suitable for mass production is shown in FIG. 11. In this apparatus space can be efficiently used inside the pressure chamber by using movable multi-clamps 136, so that lots of films can be filled during one injection process. The second advantage of this design is that it bypasses the mechanical extraction process by slowly withdrawing the samples from the liquid after the injection is completed.

The operation steps of apparatus 130 are as follows. First samples 138 and metal pieces 140 are loaded into the pressure/vacuum chamber 132. Next, the chamber 132 is evacuated to a desired level using a vacuum means 144 and the chamber 132 is heated with a heating means 134 to a suitable temperature to degas the porous film 138.

Next the temperature of the chamber is increased to a point higher than $T_m$ of the metal to generate molten metal. The samples are then thoroughly immersed into the molten metal via clamps 136. Next high pressure Ar gas is introduced into the chamber via means 142. After injection is completed, the metal filled samples are slowly withdrawn from the liquid 140.

Next the chamber is cooled at a predetermined rate to allow the molten metal to solidify and crystallize inside the pores of the substrate 138 and the chamber is then depressurized.

The pressure required to inject molten metal into the aluminum oxide pores is in the range of 0 bar to about 350 bar. Where the metal to be injected is busmuth, the pressure may range from 0 bar to about 315 bar.

Figure 12:
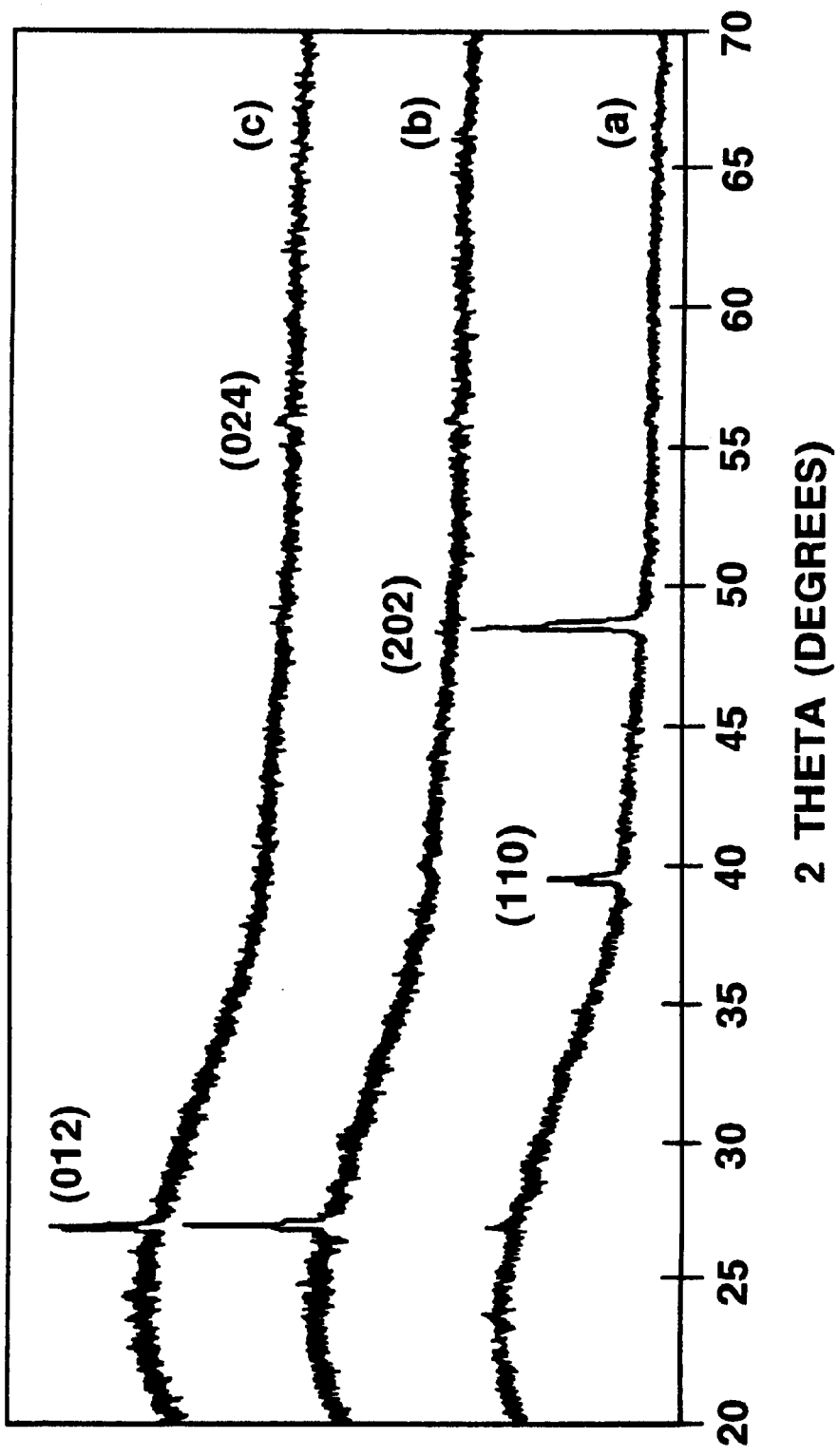
FIG. 12 is a plot of an x-ray diffraction (XRD) pattern of a bismuth nanowire array made from an anodic aluminum oxide film.
Figure 13:
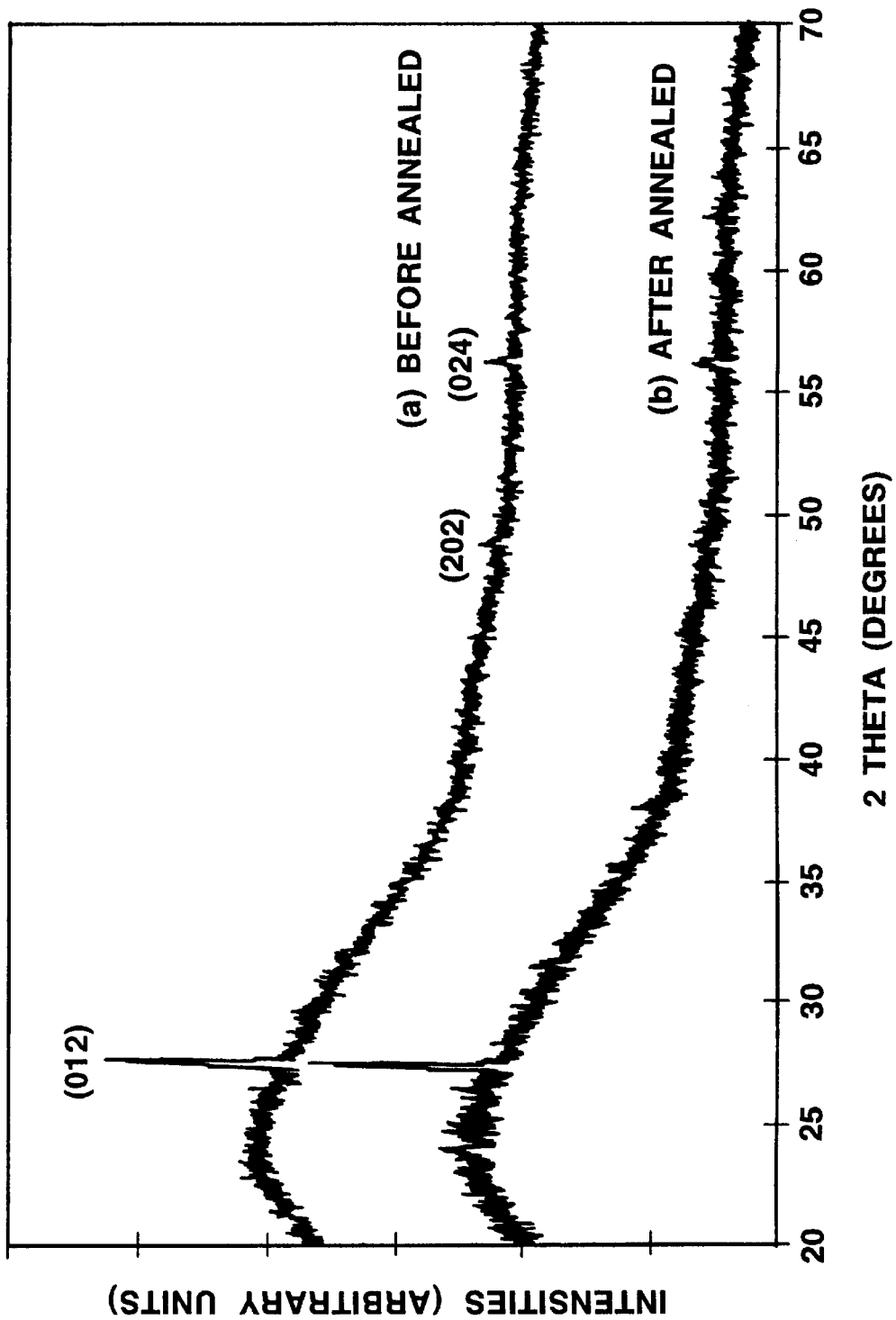
FIG. 13 is a plot of an XRD pattern for an array of bismuth nanowires formed in an anodic aluminum oxide film.

FIGS. 12 and 13 show XRD patterns for the Bi-filled films with different wire diameters. All peaks shown on the XRD patterns are very close to the peak positions of 3D bulk Bi, revealing that the rhombohedral lattice structure of bulk Bi also occurred in the small nanowires. The XRD peaks are very narrow and no peak broadening was observed within the instrumental limit, which indicates long range periodicity of the Bi lattice structure along the wire length. In FIG. 12, for sample (a), with an average diameter of 56 nm for the Bi wire, only three strong peaks ((202), (110), (012)) are observed. For sample (b) and sample (c), with 23 and 13 nm diameter, respectively, only two peaks ((012) and (024)) are found, both belonging to the same lattice direction. We therefore conclude that the individual Bi nanowires are essentially single crystal and are all similarly oriented. The lattice orientation along the wires in sample (b) and (c) are very close to the bisectrix direction of the rhombohedral Bi structure, which is a direction along which electrons have very high mobility. This single crystal orientation of the array of the Bi nanowires will be very important for many applications, such as study of the transport properties of 1D Bi nanowires. In the XRD patterns, we did not observe peaks normal to the wire, which should be very broad due to the small diameters of the wires. The disappearance of these peaks may be attributed to the lack of intensities or to their large line width so that they are buried under the background generated by the anodic alumina and the glass slide.

Another phenomena which we observed in the crystalline structure of Hi nanowires is the metastable phase generated inside the small nanochannels.

Shown in FIG. 13 are XRD patterns of the 13 nm sample before and after an annealing treatment. In the as-prepared sample, we observed a small peak- ((202)), and this small peak disappeared after ainnealing the sample at 200° C. for 8 hours under flowing $N_2$.

Figure 14:
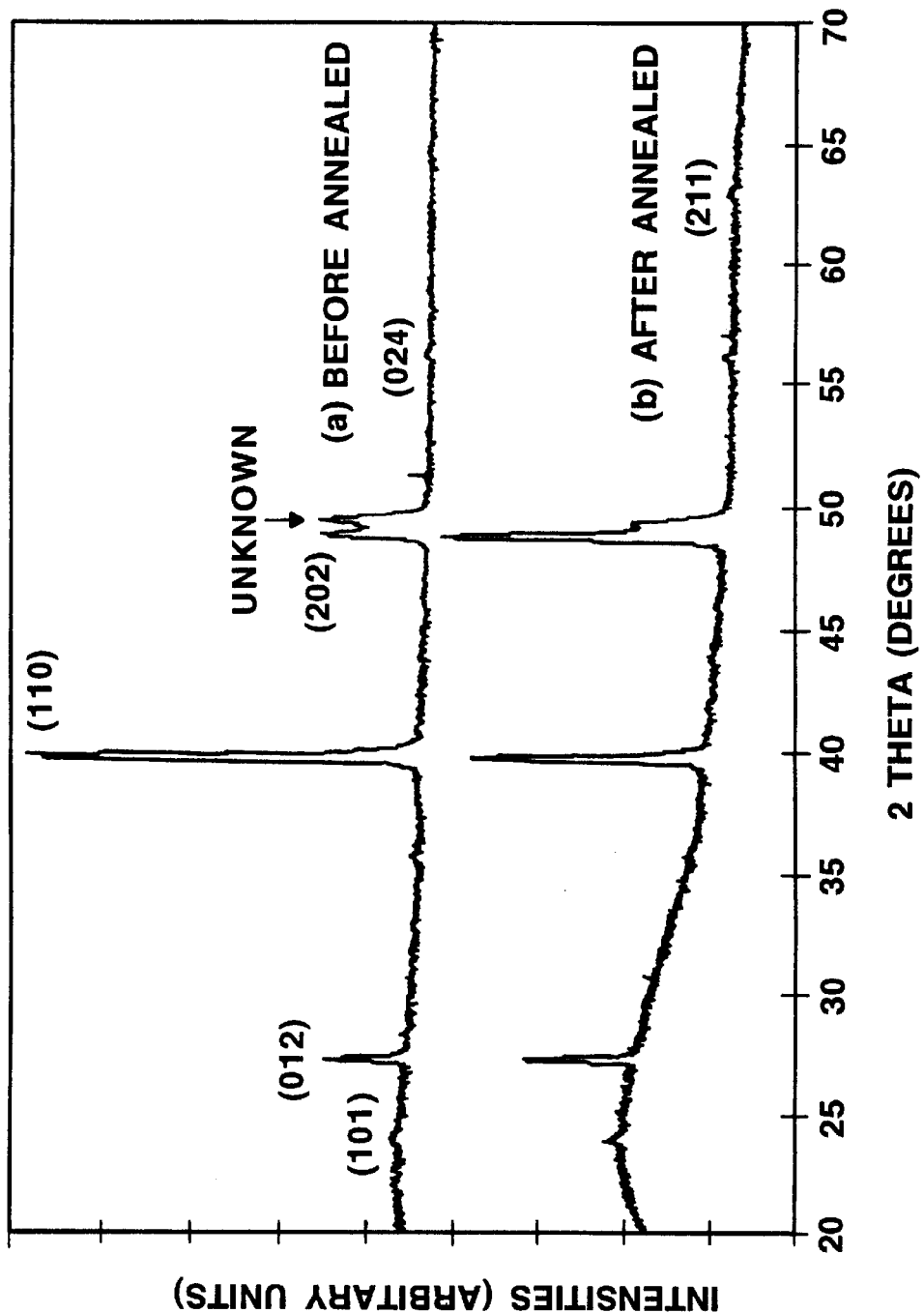
FIG. 14 is a plot of an XRD pattern for a bismuth nanowire array formed in an anodic aluminum oxide film.

Shown in FIG. 14 are XRD patterns for the 56 nm sample. The as-prepared sample has a peak at a value 2θ~49.36° which doesn't belong to bulk Bi, and the intensity was reduced after annealing at 200° C. for 8 hours. The metastable phase related to the 49.36° peak probably is a high pressure phase due to the high stress induced by the lattice mismatch between the Bi ninowires and the anodic alumina template. If this is true, this is believed to be the first high pressure phase generated inside nanochannels.

If there is a lattice stretch, we should observe some peak shifts relative to the 3D Bi peak positions. However, we did not observe any peak position shift within the instrumental limit. Since all the peaks observed are along the wire axis, and Bi-Bi interactions along the wire should outweigh the Bi-template interactions, the absence of peak position shift is not surprising. The lattice stress at the directions normal to the wire axis should be much higher than that along the wire axis, but unfortunately, we were unable to observe the peaks normal to the wire axis in XRD patterns.

Figure 8:
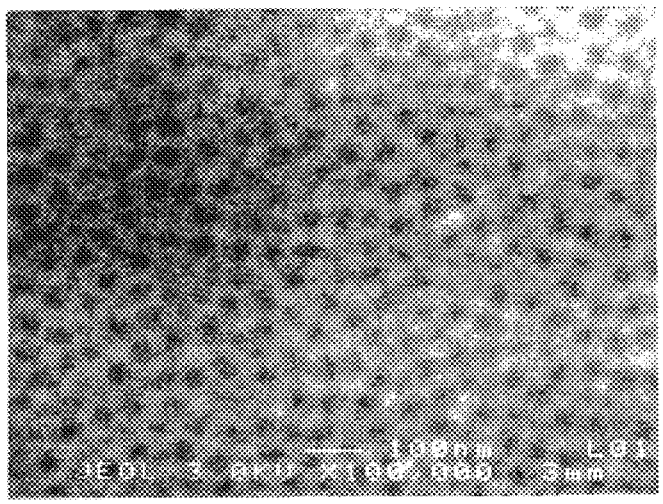
FIGS. 8–8A are a series of SEM images of a top surface of an anodic aluminum oxide film having pores filled with bismuth.
Figure 8A:
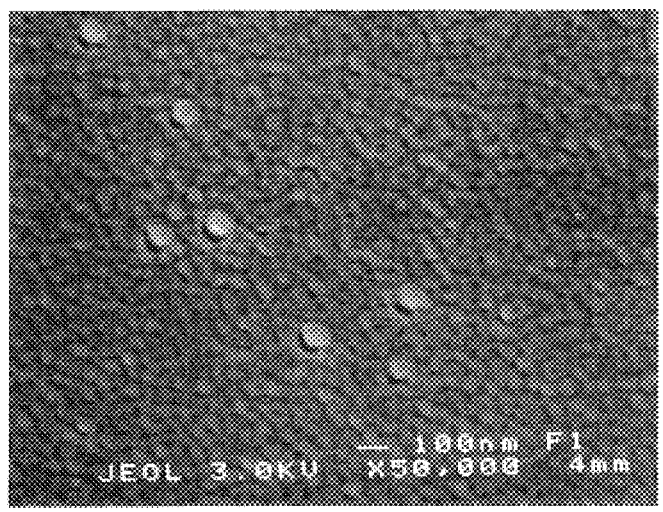

The Bi nanowire/ceramic composite structures were also characterized by SEM techniques. The SEM images of the topside surface of the Bi filled film (see FIGS. 8–8A) showed that Bi had entered all the channels of the film. No unfilled entrance nor excess Bi particles or pieces were observed on the topside surface. A very thin layer of Bi (thinner than 10 nm) was found to coat the topside surface of the film. This very thin coating layer of Bi would be advantageous for future applications involving transport properties, since it may serve as art electric contact for the Bi nanowires.

Figure 9:
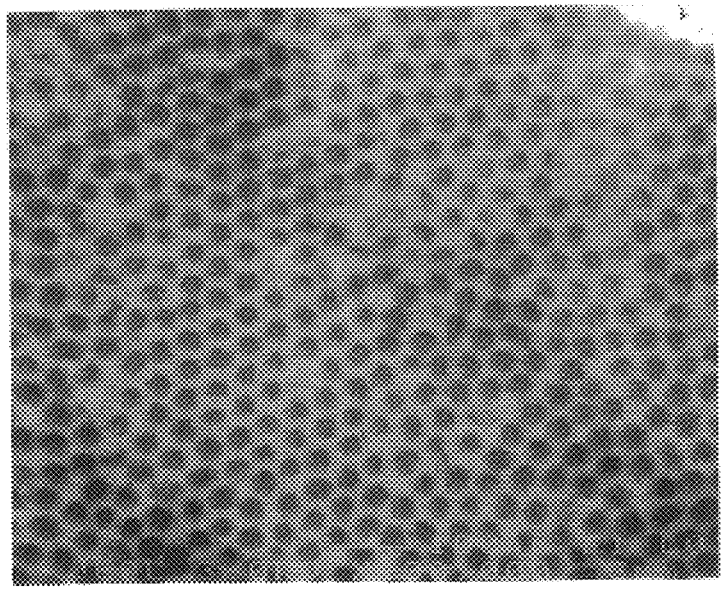
FIGS. 9–9A are a series of SEM images of a bottom surface of an anodic aluminum oxide film having bismuth filled pores after the removal of a barrier layer.
Figure 9A:
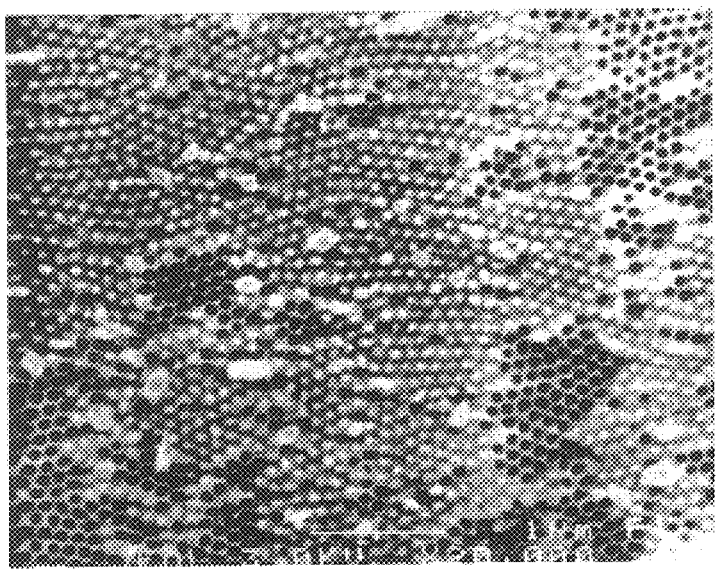

As for the backside of the film, after removing the alumina barrier layer, SEM images (see FIGS. 9 and 9A) showed that there was a short distance between the majority of Bi nanowires and the channel entrances, although some channels were filled up to the entrance. This empty portion of channels could be removed by mechanical polishing or chemical etching.

In order to confirm that the whole porous film has been filled by Bi nanowires, we developed a method to dissolve the anodic alumina matrix and expose the Bi nanowires. Since the SEM images proved that Bi had entered all channels from the topside of the film, we partially dissolve the film from the backside. If we can show that Bi nanowires have filled the channels close to tihe backside surface, then there is no doubt that the channels were thoroughly filled by Bi. This is exactly what we observed from the SEM images (FIG. 10–10B).

Figure 15:
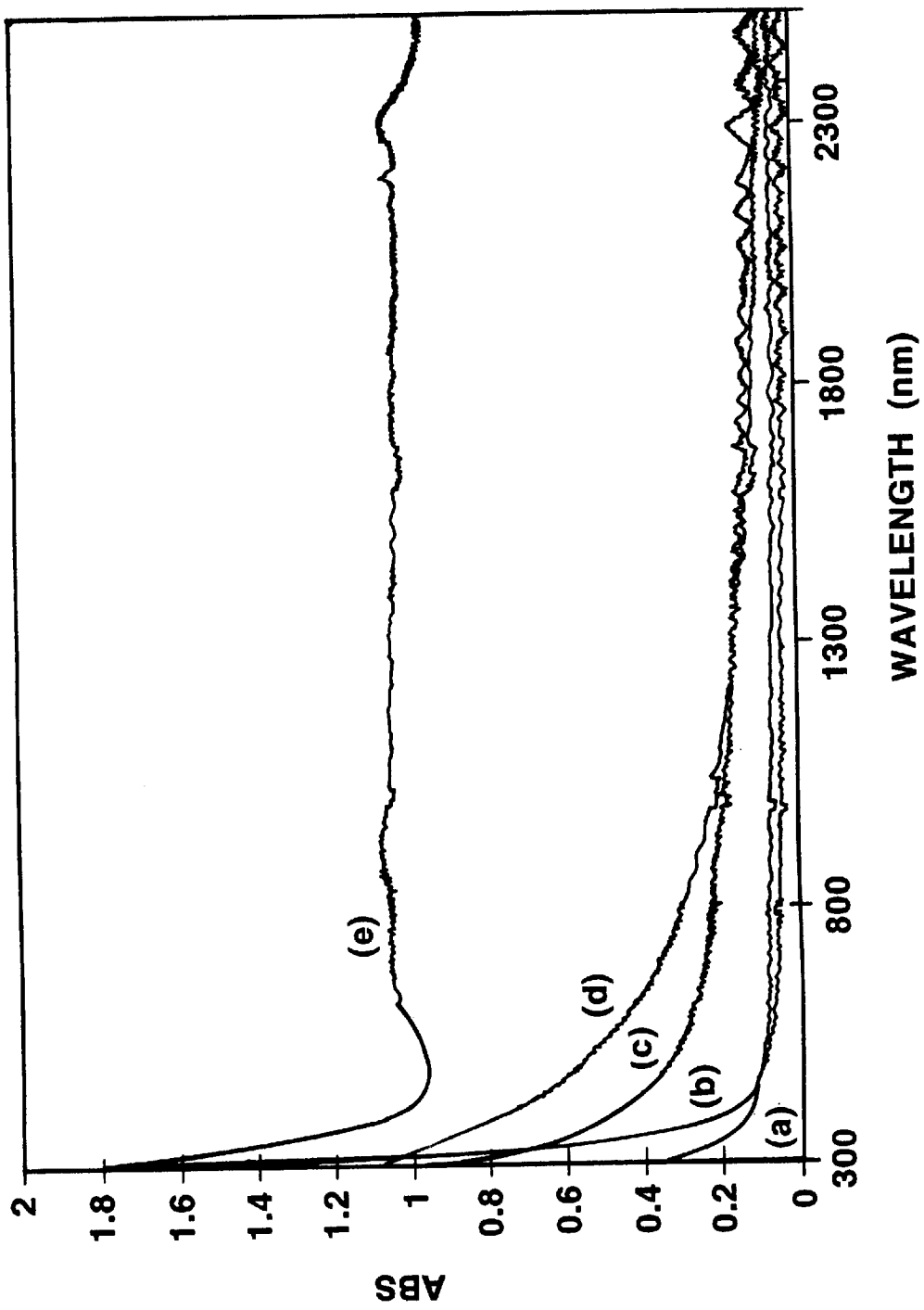
FIG. 15 is a plot of optical transmission spectra of an anodic aluminum oxide film and a plurality of bismuth nanowire arrays formed in an anodic aluminum oxide film.

Shown in FIG. 15 is the optical absorbance of anodic alumina templates and Bi nanowire array composites with different wire diameters. The anodic alumina film prepared by a 20 wt % $H_2SO_4$ solution (FIG. 15 line a) did not absorb photons until a wavelength below 420 nm was reached, corresponding to a band gap energy of approximately 3.4 eV. For the arodic alumina film prepared by a 4 wt % $H_2C_2O_4$ solution (FIG. 15 line c), the absorption edge slightly shift to the right, corresponding to a band gap energy slightly lower than 3.3 eV. As for the Bi filled samples, the 56 nm diameter sample (FIG. 15e) had an absorbance close to 1 throughout the whole spectrum (300–3000 nm).

Figure 16:
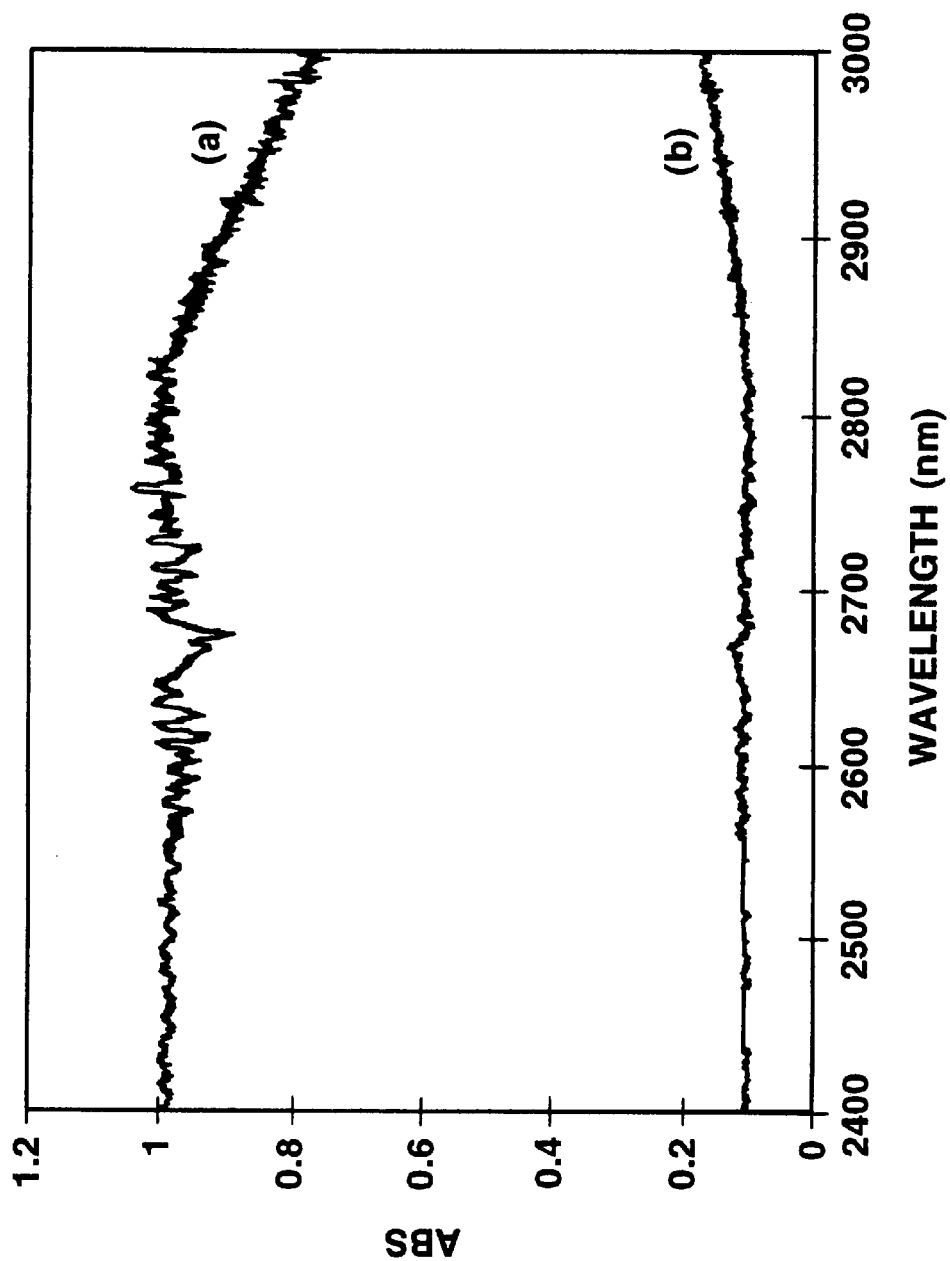
FIG. 16 is a plot of optical transmission spectra for an anodic aluminum oxide film and an array of bismuth nanowires formed in an anodic aluminum oxide film.

The optical absorbance of the 56 nm sample, for wavelength between 2400 and 3000 nm, is shown in FIG. 16. The absorbance slightly decreased for wavelength larger than 2800 nm (FIG. 16a), perhaps indicating that the Bi nanowires with 56 nm average diameter already became a narrow band gap semiconductor, with a band gap smaller than 0.5 eV. The reason that the absorbance of the 56 nm diameter sample is not even higher, i.e., much larger than 1, is due to the photons that are transmitted through the alumina matrix.

The 23 nm diameter sample (FIG. 15 line d) had an absorption edge starting at a wavelength of around 1300 nm with a significant increase at about 1000 nm, corresponding to a band gap energy between 1.1 eV to 1.4 eV. The reason that the curve does not show a sharp rising edge may be attributed to the distribution of the wire diameters in this sample. For the 13 nm diameter sample (FIG. 15 line c), the absorption starts at around 900 nm with a sharp increase at about 650 nm. This indicates a band gap energy between 1.5 eV to 2.1 eV. The distribution of wire diameter also explains the absence of a sharp rising edge for the 13 nm diameter sample.

A band gap energy of about 2 eV may be too large for Bi to be explained solely by 2D quantum confinement in the nanowires. It may be explained by the stress-induced high pressure phase of Bi nanowires inside the nanotubes. It was known that the rhombohedral lattice structure of 3D bulk Bi will be stretched more along the trigonal direction when under hydrostatic pressure. The high stress due to the lattice mismatch between the Bi and the anodic alumina might help this kind of lattice stretch thereby enhancing the semimetal to semiconductor transition. In XRD patterns of the Bi nanowire composite, we observed one metastable peak which does not belong to the 3D bulk Bi, and this might be another sign of the high pressure phase. So we believe that the wide band gap of the ultra-fine Bi nanowire composites is due to both a lattice stretch and the quantum confinement effect in the two directions normal to the wire axis.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method for providing a substrate for use in the fabrication of a nanowire array comprising:
   a) preparing an aluminum substrate;
   b) anodizing the aluminum substrate using an acidic electrolyte solution to provide a porous aluminum oxide film on a surface of said aluminum substrate;
   c) contacting said porous aluminum oxide film with an acid etchant solution for a period of time sufficient to enlarge the cell size of the pores of said aluminum oxide film, said acid selected from the group consisting of $H_3PO_4$ and $H_2C_2O_4$; and
   d) contacting said etched film from step (c) with a solution of $H_2SO_4$.

2. The method of claim 1 wherein said aluminum substrate is polished prior to anodization.

3. The method of claim 1 wherein the aluminum substrate is anodized under constant voltage conditions.

4. The method of claim 1 wherein:
   the acidic electrolyte solution has a weight of $H_2SO_4$ in the range of about 15 percent to about 20 percent; and
   the anodizing voltage has a value in the range of about 5 volts to about 30 volts.

5. The method of claim 4 where:
   the acidic electrolyte solution has a weight of $H_2SO_4$ in the range of about 15 percent to about 20 percent; and
   the anodizing voltage has a value in the range of about 13 volts to about 25 volts.

6. The method of claim 1 wherein:
   the acidic electrolyte solution has a weight of $H_2C_2O_4$ of about 1 to about 8 percent; and
   the anodizing voltage has a value in the range of about 5 volts to about 120 volts.

7. The method of claim 6 wherein:
   the acidic electrolyte solution has a weight of $H_2C_2O_4$ of about 4 percent; and
   the anodizing voltage has a value in the range of about 30 volts to about 60 volts.

8. The method of claim 1 wherein:
   the acidic electrolyte solution has a weight of $H_3PO_4$ in the range of about 4 percent to about 8 percent; and
   the anodizing voltage has a value in the range of about 5 volts to about 200 volts.

9. The method of claim 8 wherein:
   the acidic electrolyte solution has a weight of $H_3PO_4$ in the range of about 4 percent to about 8 percent; and
   the anodizing voltage has a value in thie range of about 15 volts to about 120 volts.

10. The method of claim 1 where the step of anodizing includes the step of providing a current having an amplitude between about 1 and about 200 $mA/cm^2$ of substrate surface.

11. The method of claim 10 where the step of anodizing includes the step of providing a current having an amplitude between about 1 and about 80 $mA/cm^2$ of substrate surface.

12. The method of claim 11 where the step of anodizing includes the step of providing a current having an amplitude between about 5 and about 40 $mA/cm^2$ of substrate surface.

13. The method of claim 1 wherein the anodizing electrolyte temperature is in the range of about $-5°$ C. to about $50°$ C.

14. The method of claim 13 wherein the anodizing electrolyte temperature is in the range of about $0°$ C. to about $10°$ C.

15. The method of claim 1 wherein the acidic electrolyte solution comprises $H_2C_2O_4$ at a weight in the range of about 1 percent to about 8 percent.

16. The method of claim 1 wherein the acidic electrolyte solution comprises $H_3PO_4$ at a weight in the range of about 1 percent to about 40 percent.

17. The method of claim 16 wherein the acidic electrolyte solution has a weight of $H_3PO_4$ in the range of about 4 percent to about 8 percent.

18. The method of claim 1 wherein said step of preparing an aluminum substrate comprises electrochemical polishing of said substrate.

19. The method of claim 18 wherein the step of electrochemical polishing includes the steps of:
   calcining the substrate in air at a predetermined temperature for a predetermined period of time to provide the substrate having a uniform surface oxide layer;
   placing the aluminum substrate in an electrolyte provided from a polishing acid solution;
   providing a cathode; and
   applying a voltage.

20. The method of claim 19 wherein the composition of the polishing acid solution is 95 vol % phosphoric acid solution (85 wt %)+5 vol % sulfuric acid solution (97 wt %)+20 g/l chromium oxide ($CrO_3$) and whereirn the temperature of the electrolyte is about $85°$ C.

21. The method of claim 19 wherein said voltage is in the range of about 20 to about 24 V.

22. The method of claim 1 wherein the cell size of said porous aluminum oxide film prepared in step (b) is determined in accordance with the formula C=[M]mV, wherein C is the cell size in nanometers, V is the anodizing voltage and [M]m is a constant in the range of 2.0 to 2.5.

23. The method of claim 1 further including the step of:
   e) injecting molten material into the pores of said aluminum oxide film to form a plurality of nanowires.

24. The method of claim 23 wherein:
the molten material is provided from a material having a melting temperature lower than a temperature at which the substrate undergoes a structural change.

25. The method of claim 24 wherein the molten material is provided from a metal, a semiconductor, an alloy or a polymer gel.

26. The method of claim 23 further comprising the step of removing the aluminum oxide film from the aluminum substrate.

27. The method of claim 23 wherein said anodic aluminum oxide film is removed from said substrate after step (e).

28. The method of claim 23 wherein said nanowires have a diameter in the range of about 1 to 500 nm.

29. The method of claim 28 wherein said nanowires have a diameter in the range of about 8 to 200 nm.

30. The method of claim 23 wherein the step of injecting molten material comprises melting a material in a vacuum to provide the molten material and injecting the molten material with a pressure in the range of 0 bar to about 350 bar.

31. The method of claim 30 wherein said molten material is a metal.

32. The method of claim 31 further comprising the step of cooling the molten metal injected into said plurality of pores at a predetermined rate such that said nanowires form a single crystal structure.

33. The method of claim 31 wherein said metal comprises bismuth and said pressure is in the range of 0 bar to about 115 bar.

34. The method of claim 1 wherein the acidic electroyte solution comprises $H_2SO_4$ at a weight of $H_2SO_4$ in the range of about 5 percent to about 40 percent.

35. The method of claim 34 wherein the electrolyte solution has a weight of $H_2SO_4$ in the range of about 15 percent to about 20 percent.

36. The method of claim 35 wherein the electrolyte solution has a weight of $H_2SO_4$ in the range of about 1 percent to about 20 percent.

* * * * *

UNITED STATES PATENT AND TRADEMARK OFFICE
CERTIFICATE OF CORRECTION

PATENT NO. : 6,231,744 B1
DATED : May 15, 2001
INVENTOR(S) : Jackie Y. Ying et al.

It is certified that error appears in the above-identified patent and that said Letters Patent is hereby corrected as shown below:

Title page,
Item [57], ABSTRACT,
Line 1, delete "relatvley" and replace with -- relatively --.

Column 1,
Line 67, delete "as a one" and replace with -- as one --.

Column 3,
Line 37, delete "gallium(Ga)" and replace with -- gallium (Ga) --.
Line 66, delete "cos θ" and replace with -- cosθ --.

Column 4,
Line 4, delete "vy," and replace with -- $\gamma_{sv}$ --.
Line 8, delete "cos θ" and replace with -- cosθ --.

Column 5,
Line 43, delete "is provide" and replace with -- is provided as a --.

Column 6,
Lines 36 and 40, delete "cos θ" and replace with -- cosθ --.

Column 8,
Line 4, delete "cpfSEM im ages" and replace with -- of SEM images --.
Line 5, delete "m" and replace with -- film --.

Column 9,
Line 8, delete "preferable" and replace with -- preferably --.
Line 20, delete "raay" and replace with -- may --.
Line 49, delete "electro deposition" and replace with -- electro-deposistion --.

Column 10,
Line 15, delete "provide the an anodic" and replace with -- provide the anodic --.
Line 19, delete "may be provide" and replace with -- may be provided --.
Line 29, delete "a necessary" and replace with -- necessary --.
Line 34, delete "substrate," and replace with -- substrate, --.

UNITED STATES PATENT AND TRADEMARK OFFICE
CERTIFICATE OF CORRECTION

PATENT NO. : 6,231,744 B1
DATED : May 15, 2001
INVENTOR(S) : Jackie Y. Ying et al.

It is certified that error appears in the above-identified patent and that said Letters Patent is hereby corrected as shown below:

Column 11,
Line 13, delete "C." and replace with -- C --.
Line 35, delete "haliing" and replace with -- having --.
Line 66, delete "useid" and replace with -- used --.

Column 12,
Line 52, delete "C." and replace with -- C --.
Line 65, delete "C.," and replace with -- C, --.

Column 13,
Line 23, delete "used" and replace with -- was used --.
Line 49, delete "C. for" and replace with -- C for --.
Lines 52 and 53, delete "C.)" and replace with -- C) --.
Line 63, delete "C./" and replace with -- C/ --.
Line 65, delete "C." and replace with -- C --.
Line 66, delete "were found" and replace with -- was found --.

Column 14,
Line 3, delete "C." and replace with -- C --.
Line 14, delete "C./" and replace with -- C/ --.
Line 33, delete "as source" and replace with -- as a source --.
Line 54, delete "was not be able" and replace with -- was not able --.

Column 15,
Line 20, delete "paraffm" and replace with -- paraffin --.
Line 45, delete "using an" and replace with -- using a --.

Column 16,
Line 11, delete "$10^9$." and replace with -- $10^9$, --.
Line 16, delete "FIGS. 7C-7E, show" and replace with -- FIGS. 7C-7E show --.

Column 17,
Line 58, delete "Hi" and replace with -- Bi --.
Line 63, delete "C." and replace with -- C --.
Line 62, delete "((202))" and replace with -- (202) --.

UNITED STATES PATENT AND TRADEMARK OFFICE
CERTIFICATE OF CORRECTION

PATENT NO.    : 6,231,744 B1
DATED         : May 15, 2001
INVENTOR(S)   : Jackie Y. Ying et al.

It is certified that error appears in the above-identified patent and that said Letters Patent is hereby corrected as shown below:

<u>Column 18,</u>
Line 1, delete "C." and replace with -- C --.

Signed and Sealed this

Seventeenth Day of December, 2002

JAMES E. ROGAN
*Director of the United States Patent and Trademark Office*